United States Patent
Ghanbari et al.

(10) Patent No.: US 10,243,136 B2
(45) Date of Patent: Mar. 26, 2019

(54) PIEZOELECTRIC ENERGY HARVESTING SYSTEM FROM VEHICLE'S TIRES

(71) Applicants: Masoud Ghanbari, Bushehr (IR); Nima Amjady, Semnan (IR)

(72) Inventors: Masoud Ghanbari, Bushehr (IR); Nima Amjady, Semnan (IR)

(*) Notice: Subject to any disclaimer, the term of this patent is extended or adjusted under 35 U.S.C. 154(b) by 216 days.

(21) Appl. No.: 15/243,863

(22) Filed: Aug. 22, 2016

(65) Prior Publication Data
US 2018/0053889 A1 Feb. 22, 2018

(51) Int. Cl.
*B60L 11/18* (2006.01)
*H02J 7/32* (2006.01)
(Continued)

(52) U.S. Cl.
CPC .......... *H01L 41/1134* (2013.01); *B60B 21/00* (2013.01); *B60C 19/00* (2013.01); *B60L 11/1809* (2013.01); *H02J 7/32* (2013.01); *H02N 2/181* (2013.01); *H02N 2/186* (2013.01); *H02N 2/188* (2013.01); *B60Y 2400/209* (2013.01); *Y02T 10/7005* (2013.01); *Y02T 10/7072* (2013.01); *Y02T 10/90* (2013.01); *Y02T 90/14* (2013.01)

(58) Field of Classification Search
CPC .. H01L 41/1134; B60C 19/00; B60L 11/1879; B60L 11/002; B60L 1/00
USPC ........................................................ 320/108
See application file for complete search history.

(56) References Cited

U.S. PATENT DOCUMENTS

| | | | | | |
|---|---|---|---|---|---|
| 4,006,954 A | * | 2/1977 | Ikawa | ................... | H01R 39/00 280/735 |
| 4,237,445 A | * | 12/1980 | Crossman | ........... | B60C 23/0408 200/61.25 |

(Continued)

FOREIGN PATENT DOCUMENTS

| EP | 1650057 A2 | 4/2006 |
|---|---|---|
| EP | 1597097 B1 | 10/2007 |

(Continued)

OTHER PUBLICATIONS ("Transistor Clock Part 1: Power and Time Base," Ch00ftech, pp. 9 & 10, Posted Jun. 20, 2012, Seen Online Jun. 5, 2018, ch00ftech.com/2012/06/20/2279).*

*Primary Examiner* — Robert J Grant
*Assistant Examiner* — John T Trischler

(57) ABSTRACT

A piezoelectric energy harvesting system for converting mechanical energy of a tire of a vehicle to electrical energy includes sets of piezoelectric beam assemblies, a tire electrical jack, a conductive bearing, and an electrical storage unit. The sets of piezoelectric beam assemblies are embedded in multiple layers of the tire of the vehicle and electrically connected in a parallel configuration. Each of the sets of the piezoelectric beam assemblies are electrically connected in a series configuration for converting mechanical strains into electrical energy. The tire electrical jack is mounted on a rim of the tire and receives the electrical energy generated by the sets of piezoelectric beam assemblies via output terminals. The conductive bearing transmits the electrical energy received by the tire electrical jack to the electrical storage unit, which filters, rectifies, adapts and stores the transmitted electrical energy for powering components of the vehicle.

16 Claims, 12 Drawing Sheets

(51) Int. Cl.
*H01L 41/113* (2006.01)
*B60C 19/00* (2006.01)
*H02N 2/18* (2006.01)
*B60B 21/00* (2006.01)

(56) References Cited

U.S. PATENT DOCUMENTS

| | | | | |
|---|---|---|---|---|
| 4,764,907 A * | 8/1988 | Dahlstrom | B06B 1/0611 | 310/337 |
| 5,125,223 A * | 6/1992 | McKenna | A01D 46/243 | 56/328.1 |
| 5,187,928 A * | 2/1993 | McKenna | A01D 46/243 | 56/328.1 |
| 5,500,777 A * | 3/1996 | Hasegawa | G11B 5/592 | 310/317 |
| 5,552,656 A * | 9/1996 | Taylor | B63B 59/04 | 310/317 |
| 5,621,264 A * | 4/1997 | Epstein | H02N 2/185 | 310/339 |
| 5,644,184 A * | 7/1997 | Kucherov | F25B 21/00 | 310/306 |
| 5,838,138 A * | 11/1998 | Henty | G06F 1/1616 | 320/107 |
| 5,910,470 A * | 6/1999 | Minami | C10M 169/00 | 508/468 |
| 6,252,336 B1 * | 6/2001 | Hall | G08B 3/1041 | 310/319 |
| 6,407,484 B1 | 6/2002 | Oliver et al. | | |
| 6,489,702 B1 * | 12/2002 | Bartman | H01R 39/12 | 310/219 |
| 6,608,422 B2 * | 8/2003 | Bartman | F16C 25/08 | 310/219 |
| 6,700,310 B2 | 3/2004 | Maue et al. | | |
| 6,725,713 B2 * | 4/2004 | Adamson | B60C 23/0411 | 73/146 |
| 6,798,140 B2 * | 9/2004 | Reim | B60C 23/0411 | 152/152.1 |
| 6,807,853 B2 * | 10/2004 | Adamson | B60C 23/0411 | 73/146 |
| 6,847,126 B2 * | 1/2005 | Adamson | B60C 11/00 | 152/152.1 |
| 7,005,987 B2 * | 2/2006 | Sinnett | B60C 23/0433 | 340/442 |
| 7,023,100 B2 * | 4/2006 | Vlad | H02N 2/18 | 152/152.1 |
| 7,047,800 B2 * | 5/2006 | Thiesen | B60C 23/0411 | 73/146 |
| 7,079,042 B2 * | 7/2006 | Reim | B60C 13/001 | 340/425.5 |
| 7,081,693 B2 * | 7/2006 | Hamel | B60C 23/0411 | 307/151 |
| 7,096,727 B2 * | 8/2006 | Adamson | B60C 23/0411 | 307/44 |
| 7,116,213 B2 * | 10/2006 | Thiesen | G06K 19/0675 | 340/10.1 |
| 7,126,497 B2 * | 10/2006 | Face | H03K 17/965 | 341/20 |
| 7,132,939 B2 * | 11/2006 | Tyndall | B60C 23/0411 | 340/447 |
| 7,138,911 B2 * | 11/2006 | Tyndall | B60C 23/0411 | 340/447 |
| 7,170,201 B2 * | 1/2007 | Hamel | B60C 23/0411 | 307/151 |
| 7,224,100 B2 * | 5/2007 | Thiesen | B60C 23/0408 | 310/313 R |
| 7,256,505 B2 * | 8/2007 | Arms | B60C 23/0411 | 290/1 R |
| 7,260,984 B2 * | 8/2007 | Roundy | B60C 23/0411 | 73/146.5 |
| 7,313,467 B2 * | 12/2007 | Breed | G07C 5/008 | 307/9.1 |
| 7,361,998 B2 * | 4/2008 | Hamel | B60C 23/0411 | 290/1 R |
| 7,365,455 B2 * | 4/2008 | Hamel | B60C 23/0411 | 307/151 |
| 7,429,801 B2 * | 9/2008 | Adamson | B60C 23/0411 | 290/1 R |
| 7,429,805 B2 * | 9/2008 | Hamel | B60C 23/0411 | 307/9.1 |
| 7,444,210 B2 * | 10/2008 | Breed | G07C 5/008 | 307/9.1 |
| 7,446,459 B2 | 11/2008 | Xu et al. | | |
| 7,471,033 B2 * | 12/2008 | Thiesen | B60C 23/041 | 310/318 |
| 7,649,305 B2 | 1/2010 | Priya et al. | | |
| 7,667,375 B2 * | 2/2010 | Berkcan | H01L 41/1136 | 310/330 |
| 7,692,365 B2 | 4/2010 | Churchill et al. | | |
| 7,692,366 B2 * | 4/2010 | Thiesen | B60C 23/041 | 310/339 |
| 7,692,559 B2 * | 4/2010 | Face | H03K 17/951 | 307/119 |
| 7,706,930 B2 * | 4/2010 | Corniot | B60S 5/046 | 340/442 |
| 7,812,466 B2 | 10/2010 | Lu et al. | | |
| 7,812,508 B2 * | 10/2010 | Abramovich | H02N 2/18 | 310/339 |
| 7,830,071 B2 * | 11/2010 | Abramovich | H02N 2/18 | 310/339 |
| 7,834,483 B2 | 11/2010 | Kearney-Fischer et al. | | |
| 7,859,171 B2 * | 12/2010 | Micallef | H01G 9/028 | 152/152.1 |
| 7,880,370 B2 * | 2/2011 | Churchill | H02N 2/188 | 310/331 |
| 7,898,157 B2 * | 3/2011 | Churchill | H02N 2/188 | 310/330 |
| 7,928,634 B2 * | 4/2011 | Fang | H02N 2/186 | 310/339 |
| 7,936,109 B1 * | 5/2011 | Gao | H02N 2/186 | 310/329 |
| 7,948,153 B1 | 5/2011 | Kellogg et al. | | |
| 7,954,370 B2 * | 6/2011 | Gramling | G01P 15/09 | 73/146 |
| 7,977,852 B2 | 7/2011 | Ward et al. | | |
| 7,986,076 B2 | 7/2011 | Yoon et al. | | |
| 8,011,237 B2 * | 9/2011 | Gao | B60C 23/0411 | 73/146.5 |
| 8,011,255 B2 * | 9/2011 | Arms | B60C 23/0411 | 73/862.325 |
| 8,035,335 B2 * | 10/2011 | Duron | H02J 17/00 | 320/101 |
| 8,110,964 B2 | 2/2012 | Shih et al. | | |
| 8,121,754 B2 * | 2/2012 | Tyndall | B60C 23/0411 | 701/36 |
| 8,129,887 B2 | 3/2012 | Mehraeen et al. | | |
| 8,143,766 B2 * | 3/2012 | Namuduri | B60G 11/04 | 310/339 |
| 8,166,809 B2 * | 5/2012 | Weston | B60C 23/0416 | 340/442 |
| 8,166,810 B2 * | 5/2012 | Chen | H02K 35/02 | 340/442 |
| 8,193,926 B2 * | 6/2012 | Sinnett | B60C 23/0493 | 340/442 |
| 8,238,793 B2 | 8/2012 | Nakura et al. | | |
| 8,253,392 B2 * | 8/2012 | Thiesen | H02N 2/181 | 307/107 |
| 8,283,840 B2 * | 10/2012 | Mohamadi | H02N 2/186 | 310/339 |
| 8,288,923 B2 | 10/2012 | Vaidyanathan | | |
| 8,330,334 B2 | 12/2012 | Lee et al. | | |
| 8,354,778 B2 | 1/2013 | Arnold et al. | | |
| 8,405,235 B2 * | 3/2013 | DiMauro | B60C 23/041 | 290/1 R |
| 8,421,313 B2 * | 4/2013 | Shih | H01L 41/1136 | 310/330 |
| 8,446,072 B2 | 5/2013 | Mohamadi | | |

(56) References Cited

U.S. PATENT DOCUMENTS

| | | | |
|---|---|---|---|
| 8,461,700 B2* | 6/2013 | Kennedy | F03G 7/08 |
| | | | 290/1 R |
| 8,461,701 B2* | 6/2013 | Kennedy | F03G 7/08 |
| | | | 290/1 R |
| 8,466,570 B2* | 6/2013 | Kennedy | F03G 7/08 |
| | | | 290/1 R |
| 8,466,571 B2* | 6/2013 | Kennedy | F03G 7/08 |
| | | | 290/1 R |
| 8,471,395 B2* | 6/2013 | Kennedy | F03G 7/08 |
| | | | 290/1 R |
| 8,476,778 B2 | 7/2013 | Weinberger et al. | |
| 8,575,825 B2* | 11/2013 | Mohamadi | H02N 2/186 |
| | | | 310/339 |
| 8,577,261 B2* | 11/2013 | Nakura | G03G 15/755 |
| | | | 399/165 |
| 8,593,036 B2 | 11/2013 | Boysel | |
| 8,598,768 B2* | 12/2013 | Jun | H01L 41/31 |
| | | | 310/339 |
| 8,633,633 B2* | 1/2014 | Vaidyanathan | H02N 2/18 |
| | | | 310/339 |
| 8,633,634 B2 | 1/2014 | Fuentes-Fernandez et al. | |
| 8,674,663 B2 | 3/2014 | Ivanov | |
| 8,716,920 B2 | 5/2014 | Kim et al. | |
| 8,723,344 B1 | 5/2014 | Dierickx | |
| 8,797,762 B2* | 8/2014 | Yamaguchi | B60C 23/0493 |
| | | | 174/520 |
| 8,829,696 B2* | 9/2014 | Lesesky | B60C 23/041 |
| | | | 290/1 R |
| 8,841,785 B2* | 9/2014 | Theuss | B60C 19/00 |
| | | | 290/1 R |
| 8,847,425 B2* | 9/2014 | Jordan, Sr. | F03D 9/007 |
| | | | 290/55 |
| 8,860,234 B2* | 10/2014 | Hoffman | B64D 41/00 |
| | | | 290/1 R |
| 8,866,316 B2* | 10/2014 | Wood | H02N 2/188 |
| | | | 290/1 R |
| 8,878,421 B2* | 11/2014 | Kuisma | H02N 2/18 |
| | | | 310/319 |
| 8,987,973 B2* | 3/2015 | Mukter-Uz-Zaman | |
| | | | H02N 2/186 |
| | | | 310/339 |
| 9,024,509 B2* | 5/2015 | Mukter-Uz-Zaman | |
| | | | H02N 2/186 |
| | | | 310/339 |
| 9,112,374 B2* | 8/2015 | Ivanov | H02M 7/219 |
| 9,151,079 B2* | 10/2015 | Webb | H02N 2/183 |
| 9,157,421 B2* | 10/2015 | Behnia | F03G 7/08 |
| 9,160,223 B2* | 10/2015 | Membretti | H02M 1/08 |
| 9,212,654 B2* | 12/2015 | Kennedy | F03G 7/08 |
| 9,293,689 B2* | 3/2016 | Jun | H01L 41/31 |
| 9,315,078 B2* | 4/2016 | Wang | B60W 40/06 |
| 9,341,167 B2* | 5/2016 | Kennedy | F03G 7/08 |
| 9,364,675 B2* | 6/2016 | Deterre | H01L 41/0836 |
| 9,366,239 B2* | 6/2016 | Kennedy | F03G 7/08 |
| 9,385,636 B2* | 7/2016 | Hung | H02N 2/18 |
| 9,388,041 B2* | 7/2016 | Fuentes-Fernandez | |
| | | | H02N 2/186 |
| 9,410,537 B2* | 8/2016 | Kennedy | F03G 7/08 |
| 9,429,497 B2* | 8/2016 | Weston | G01M 17/02 |
| 9,450,489 B2* | 9/2016 | Gasparini | H02M 3/1584 |
| 9,461,504 B2* | 10/2016 | Ramorini | H02M 3/1588 |
| 9,470,214 B2* | 10/2016 | Kennedy | F03G 7/08 |
| 9,541,941 B2* | 1/2017 | Ramorini | H02J 50/00 |
| 9,579,936 B2* | 2/2017 | Brushaber | B60C 23/002 |
| 9,588,019 B2* | 3/2017 | Brushaber | B60C 23/003 |
| 9,694,690 B2* | 7/2017 | Fisher | B60L 11/002 |
| 9,764,606 B2* | 9/2017 | Makin | B60C 23/0469 |
| 9,787,220 B2* | 10/2017 | Herder | H02N 2/18 |
| 9,954,394 B2* | 4/2018 | Ramorini | H02J 15/00 |
| 2002/0074898 A1* | 6/2002 | Maue | B60R 25/24 |
| | | | 310/311 |
| 2002/0190598 A1* | 12/2002 | Bartman | F16C 25/08 |
| | | | 310/219 |
| 2003/0209063 A1* | 11/2003 | Adamson | B60C 23/0411 |
| | | | 73/146 |
| 2003/0209064 A1* | 11/2003 | Adamson | B60C 23/0411 |
| | | | 73/146 |
| 2004/0078662 A1* | 4/2004 | Hamel | B60C 23/0411 |
| | | | 714/22 |
| 2004/0130272 A1* | 7/2004 | Reim | B60C 23/0411 |
| | | | 315/169.3 |
| 2004/0164558 A1* | 8/2004 | Adamson | B60C 11/00 |
| | | | 290/1 R |
| 2004/0211250 A1* | 10/2004 | Adamson | B60C 23/0411 |
| | | | 73/146 |
| 2005/0017602 A1* | 1/2005 | Arms | B60C 23/0411 |
| | | | 310/339 |
| 2005/0062350 A1* | 3/2005 | Kuo | F16C 33/6633 |
| | | | 310/90 |
| 2005/0105231 A1* | 5/2005 | Hamel | B60C 23/0411 |
| | | | 361/90 |
| 2005/0110277 A1* | 5/2005 | Adamson | B60C 23/0411 |
| | | | 290/1 R |
| 2005/0116544 A1* | 6/2005 | Hamel | B60C 23/0411 |
| | | | 307/46 |
| 2005/0116545 A1* | 6/2005 | Hamel | B60C 23/0411 |
| | | | 307/46 |
| 2005/0127676 A1* | 6/2005 | Vlad | H02N 2/18 |
| | | | 290/1 R |
| 2005/0140212 A1* | 6/2005 | Hamel | B60C 23/0411 |
| | | | 307/44 |
| 2005/0146220 A1* | 7/2005 | Hamel | B60C 23/0411 |
| | | | 307/44 |
| 2005/0174225 A1* | 8/2005 | Kuchler | B60C 23/041 |
| | | | 340/445 |
| 2005/0274176 A1* | 12/2005 | Thiesen | B60C 23/0411 |
| | | | 73/146 |
| 2005/0285569 A1* | 12/2005 | Rao | B60C 23/0411 |
| | | | 320/128 |
| 2005/0285728 A1 | 12/2005 | Tyndall | |
| 2006/0006991 A1* | 1/2006 | Tyndall | B60C 23/0411 |
| | | | 340/442 |
| 2006/0021261 A1 | 2/2006 | Face | |
| 2006/0028333 A1* | 2/2006 | Tyndall | B60C 23/0411 |
| | | | 340/447 |
| 2006/0180371 A1* | 8/2006 | Breed | G07C 5/008 |
| | | | 180/197 |
| 2006/0255663 A1 | 11/2006 | Vlad | |
| 2007/0001110 A1* | 1/2007 | Meinders | G11B 7/0037 |
| | | | 250/234 |
| 2007/0074566 A1 | 4/2007 | Roundy | |
| 2007/0080036 A1* | 4/2007 | Elie | F16D 27/06 |
| | | | 192/21.5 |
| 2007/0096565 A1* | 5/2007 | Breed | B60C 23/0408 |
| | | | 307/116 |
| 2007/0114890 A1* | 5/2007 | Churchill | H01L 41/1136 |
| | | | 310/339 |
| 2007/0257634 A1 | 11/2007 | Leschin | |
| 2008/0001577 A1* | 1/2008 | Sather | B60C 23/0411 |
| | | | 320/162 |
| 2008/0047363 A1* | 2/2008 | Arms | B60C 23/0411 |
| | | | 73/862 |
| 2008/0062013 A1* | 3/2008 | Face | H03K 17/951 |
| | | | 341/20 |
| 2008/0074002 A1* | 3/2008 | Priya | H01L 41/1136 |
| | | | 310/339 |
| 2008/0129147 A1* | 6/2008 | Thiesen | B60C 23/041 |
| | | | 310/319 |
| 2008/0129475 A1* | 6/2008 | Breed | G07C 5/008 |
| | | | 340/438 |
| 2008/0136292 A1* | 6/2008 | Thiesen | B60C 23/041 |
| | | | 310/334 |
| 2008/0174273 A1* | 7/2008 | Priya | H01L 41/1136 |
| | | | 320/114 |
| 2008/0212262 A1* | 9/2008 | Micallef | H01G 9/028 |
| | | | 361/502 |
| 2008/0238260 A1* | 10/2008 | Xu | H01L 41/1138 |
| | | | 310/339 |
| 2008/0252174 A1 | 10/2008 | Mohammadi et al. | |

(56) References Cited

U.S. PATENT DOCUMENTS

| | | | |
|---|---|---|---|
| 2009/0085409 A1* | 4/2009 | Kearney-Fischer | H02S 40/44 307/115 |
| 2009/0127976 A1* | 5/2009 | Ward | F03G 7/08 310/319 |
| 2009/0134710 A1* | 5/2009 | Tyndall | B60C 23/0411 307/104 |
| 2009/0167110 A1* | 7/2009 | Berkcan | H01L 41/1136 310/323.01 |
| 2009/0174361 A1 | 7/2009 | Duron et al. | |
| 2009/0180805 A1* | 7/2009 | Nakura | G03G 15/755 399/165 |
| 2009/0195122 A1 | 8/2009 | Abramovich et al. | |
| 2009/0195124 A1 | 8/2009 | Abramovich et al. | |
| 2009/0195222 A1* | 8/2009 | Lu | H02N 2/188 322/3 |
| 2009/0195226 A1 | 8/2009 | Abramovich et al. | |
| 2009/0211353 A1 | 8/2009 | Gao et al. | |
| 2009/0212665 A1* | 8/2009 | Koser | B60C 23/0411 310/339 |
| 2009/0256361 A1 | 10/2009 | Theuss et al. | |
| 2009/0261689 A1 | 10/2009 | Fang | |
| 2009/0315694 A1* | 12/2009 | Sinnett | B60C 23/0411 340/438 |
| 2010/0083746 A1 | 4/2010 | Chen et al. | |
| 2010/0084947 A1 | 4/2010 | Yoon et al. | |
| 2010/0102782 A1* | 4/2010 | Thiesen | H02N 2/181 320/166 |
| 2010/0141094 A1 | 6/2010 | Lee et al. | |
| 2010/0141096 A1 | 6/2010 | Churchill et al. | |
| 2010/0147061 A1* | 6/2010 | Weston | B60C 23/0411 73/146 |
| 2010/0148519 A1* | 6/2010 | Shih | H01L 41/1136 290/1 R |
| 2010/0171394 A1 | 7/2010 | Glenn et al. | |
| 2010/0194239 A1* | 8/2010 | Mehraeen | H01L 41/1136 310/319 |
| 2010/0194240 A1* | 8/2010 | Churchill | H01L 41/1136 310/319 |
| 2010/0219720 A1 | 9/2010 | Namuduri et al. | |
| 2010/0253088 A1* | 10/2010 | Weinberger | F03G 5/00 290/1 C |
| 2010/0289271 A1 | 11/2010 | DiMauro et al. | |
| 2010/0308664 A1* | 12/2010 | Face | H02J 13/0075 307/104 |
| 2010/0314968 A1* | 12/2010 | Mohamadi | H02N 2/186 310/319 |
| 2011/0043161 A1* | 2/2011 | Artieda | H02N 2/18 320/107 |
| 2011/0057458 A1* | 3/2011 | Lee | H01L 41/00 290/1 R |
| 2011/0057546 A1* | 3/2011 | Vaidyanathan | H02N 2/18 310/339 |
| 2011/0060535 A1* | 3/2011 | Arms | B60C 23/0411 702/34 |
| 2011/0084499 A1* | 4/2011 | Kennedy | F03G 7/08 290/1 R |
| 2011/0084500 A1 | 4/2011 | Kennedy | |
| 2011/0084501 A1* | 4/2011 | Kennedy | F03G 7/08 290/1 R |
| 2011/0089703 A1* | 4/2011 | Kennedy | F03G 7/08 290/1 C |
| 2011/0089762 A1* | 4/2011 | Kennedy | F03G 7/08 307/43 |
| 2011/0101701 A1* | 5/2011 | Kennedy | F03G 7/08 290/1 C |
| 2011/0101827 A1* | 5/2011 | Yoon | H02N 2/186 310/339 |
| 2011/0156532 A1 | 6/2011 | Churchill | |
| 2011/0210554 A1 | 9/2011 | Boysel | |
| 2011/0215590 A1* | 9/2011 | Arnold | H02K 7/1892 290/1 R |
| 2011/0227543 A1* | 9/2011 | Ivanov | H02M 7/219 320/163 |
| 2011/0252845 A1 | 10/2011 | Webb et al. | |
| 2011/0292630 A1* | 12/2011 | Yamaguchi | B60C 23/0493 361/807 |
| 2012/0007469 A1 | 1/2012 | Matova et al. | |
| 2012/0049694 A1 | 3/2012 | van Schaijk et al. | |
| 2012/0068577 A1 | 3/2012 | Koser et al. | |
| 2012/0119625 A1* | 5/2012 | Shih | H01L 41/1136 310/339 |
| 2012/0153778 A1 | 6/2012 | Jun et al. | |
| 2012/0169064 A1* | 7/2012 | Hoffman | B64D 41/00 290/1 R |
| 2012/0228995 A1* | 9/2012 | Mohamadi | H02N 2/186 310/319 |
| 2012/0229001 A1* | 9/2012 | Kong | B60L 7/18 310/339 |
| 2012/0257915 A1* | 10/2012 | Nakura | G03G 15/755 399/388 |
| 2012/0274132 A1* | 11/2012 | Membretti | H02M 1/08 307/9.1 |
| 2012/0274134 A1* | 11/2012 | Gasparini | H02M 3/1584 307/31 |
| 2012/0274144 A1* | 11/2012 | Gasparini | B60C 23/041 307/80 |
| 2012/0293021 A1 | 11/2012 | Teggatz et al. | |
| 2012/0299447 A1* | 11/2012 | Vaidyanathan | H02N 2/18 310/339 |
| 2012/0326565 A1 | 12/2012 | Kuisma et al. | |
| 2013/0009398 A1 | 1/2013 | Behnia et al. | |
| 2013/0020909 A1* | 1/2013 | Kim | H02N 2/18 310/339 |
| 2013/0057111 A1 | 3/2013 | Mukter-Uz-Zaman et al. | |
| 2013/0062999 A1 | 3/2013 | Mukter-Uz-Zaman et al. | |
| 2013/0140950 A1* | 6/2013 | Fuentes-Fernandez | H02N 2/18 310/319 |
| 2013/0207497 A1* | 8/2013 | Lesesky | B60C 23/041 310/152 |
| 2013/0234563 A1* | 9/2013 | Mohamadi | H02N 2/186 310/339 |
| 2013/0238072 A1 | 9/2013 | Deterre et al. | |
| 2013/0264829 A1 | 10/2013 | Jordan, Sr. | |
| 2013/0341936 A1 | 12/2013 | Wood et al. | |
| 2014/0035438 A1 | 2/2014 | Livermore-Clifford et al. | |
| 2014/0054262 A1* | 2/2014 | Jun | H01L 41/31 216/18 |
| 2014/0070935 A1 | 3/2014 | Wang et al. | |
| 2014/0084596 A1* | 3/2014 | Kennedy | F03G 7/08 290/1 R |
| 2014/0084876 A1* | 3/2014 | Ramorini | H02M 3/1588 320/166 |
| 2014/0087509 A1* | 3/2014 | Fuentes-Fernandez | H02N 2/186 438/52 |
| 2014/0152020 A1* | 6/2014 | Kennedy | F03G 7/08 290/1 R |
| 2014/0152021 A1* | 6/2014 | Kennedy | F03G 7/08 290/1 R |
| 2014/0152022 A1* | 6/2014 | Kennedy | F03G 7/08 290/1 R |
| 2014/0152023 A1* | 6/2014 | Kennedy | F03G 7/08 290/1 R |
| 2014/0191730 A1* | 7/2014 | Ivanov | H02M 7/219 320/145 |
| 2014/0232189 A1* | 8/2014 | Gasparini | H02M 3/1584 307/31 |
| 2014/0292277 A1* | 10/2014 | Chae | B60K 25/10 320/109 |
| 2014/0326062 A1* | 11/2014 | Weston | G01M 17/02 73/146 |
| 2015/0022005 A1* | 1/2015 | Jordan, Sr. | F03D 9/007 307/72 |
| 2015/0115887 A1* | 4/2015 | Hung | H02N 2/18 320/109 |

(56) References Cited

U.S. PATENT DOCUMENTS

| | | | | |
|---|---|---|---|---|
| 2015/0163864 A1* | 6/2015 | Baarman | H02J 5/005 | 99/358 |
| 2015/0180374 A1* | 6/2015 | Herder | H02N 2/188 | 310/329 |
| 2015/0251502 A1* | 9/2015 | Brushaber | B60C 23/002 | 152/418 |
| 2016/0028329 A1* | 1/2016 | Webb | E05B 13/108 | 310/339 |
| 2016/0043662 A1* | 2/2016 | Luchinskiy | A41D 27/085 | 362/103 |
| 2016/0049805 A1* | 2/2016 | Ivanov | H02M 7/219 | 320/134 |
| 2016/0134191 A1* | 5/2016 | Teggatz | H02J 7/35 | 323/271 |
| 2016/0176249 A1* | 6/2016 | Brushaber | B60C 23/003 | 73/146 |
| 2016/0272019 A1* | 9/2016 | Wang | B60W 40/06 | |
| 2016/0322559 A1* | 11/2016 | Fuentes-Fernandez | H02N 2/186 | |
| 2016/0344235 A1* | 11/2016 | Ramorini | H02M 3/1588 | |
| 2016/0380511 A1* | 12/2016 | Kennedy | F03G 7/08 | 290/1 R |
| 2017/0084817 A1* | 3/2017 | Navarro | B60C 19/00 | |
| 2017/0110936 A1* | 4/2017 | Kennedy | F03G 7/08 | |
| 2017/0182852 A1* | 6/2017 | Makin | B60C 23/0469 | |
| 2017/0246915 A1* | 8/2017 | Besnoin | B60C 11/246 | |
| 2017/0363581 A1* | 12/2017 | Makin | G01N 29/04 | |
| 2018/0048247 A1* | 2/2018 | Gerstenberger | H02N 1/08 | |

FOREIGN PATENT DOCUMENTS

| | | |
|---|---|---|
| EP | 1623849 B1 | 9/2009 |
| EP | 1803171 B1 | 3/2011 |
| EP | 1803170 B1 | 6/2011 |
| EP | 1843405 B1 | 6/2011 |
| EP | 2140505 B1 | 6/2012 |
| EP | 2065228 B1 | 4/2013 |
| KR | 20110074067 A * | 6/2011 |
| KR | 101225668 B1 * | 1/2013 |
| KR | 20140106009 A * | 9/2014 |
| WO | 1992/003910 A1 | 3/1992 |
| WO | 2002/029965 A1 | 4/2002 |
| WO | 2003/095244 A1 | 11/2003 |
| WO | 2004/076208 A1 | 9/2004 |
| WO | 2006/014622 A2 | 2/2006 |
| WO | 2006/046937 A1 | 5/2006 |
| WO | 2006/046938 A1 | 5/2006 |
| WO | 2006/102437 A2 | 9/2006 |
| WO | 2006/135370 A1 | 12/2006 |
| WO | 2007/040536 A2 | 4/2007 |
| WO | 2007/044443 A2 | 4/2007 |
| WO | 2007/131227 A2 | 11/2007 |
| WO | 2008/036088 A1 | 3/2008 |
| WO | 2008/121429 A2 | 10/2008 |
| WO | 2008/124762 A1 | 10/2008 |
| WO | 2008/156606 A2 | 12/2008 |
| WO | 2009/039293 A1 | 3/2009 |
| WO | 2009/098673 A1 | 8/2009 |
| WO | 2009/098676 A1 | 8/2009 |
| WO | 2010/005915 A2 | 1/2010 |
| WO | 2010/132109 A2 | 11/2010 |
| WO | 2011/120258 A1 | 10/2011 |
| WO | 2012/067707 A1 | 5/2012 |
| WO | 2012/094041 A1 | 7/2012 |
| WO | 2012/142420 A2 | 10/2012 |
| WO | 2012/011797 A9 | 11/2012 |
| WO | 2013/062406 A1 | 5/2013 |
| WO | 2014/074491 A1 | 5/2014 |

* cited by examiner

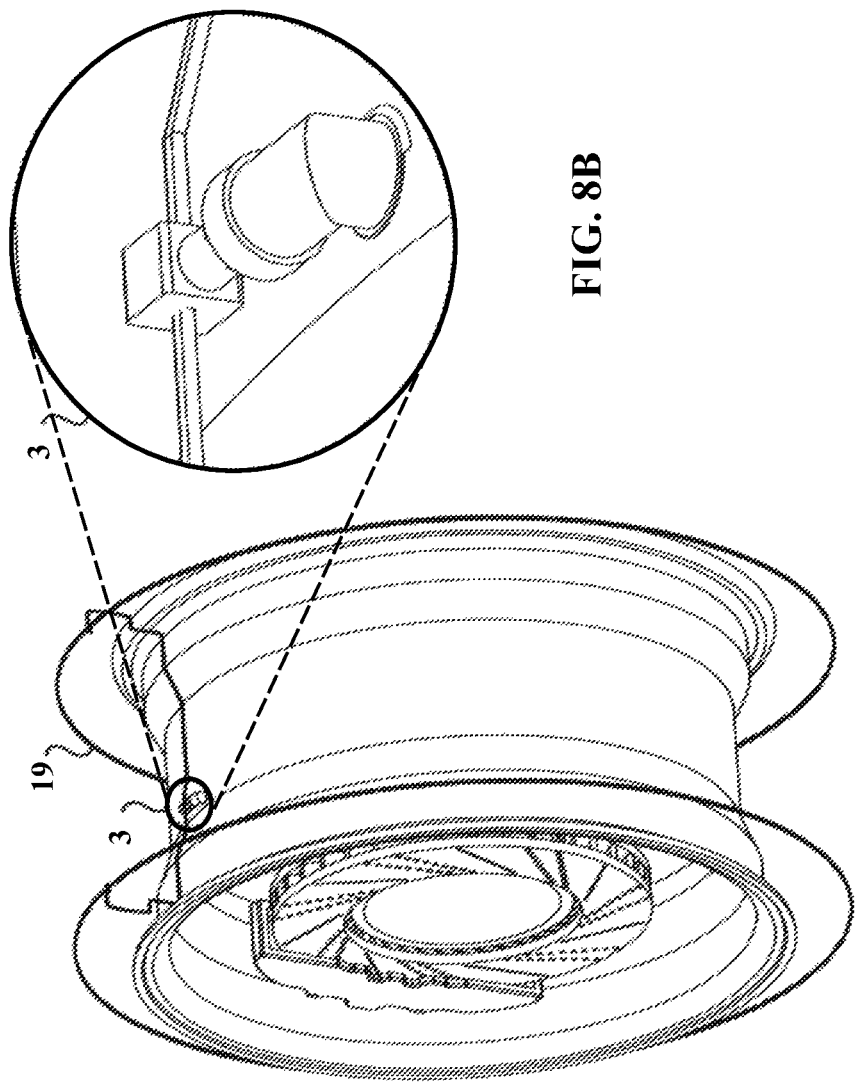

PIEZOELECTRIC ENERGY HARVESTING SYSTEM FROM VEHICLE'S TIRES

BACKGROUND OF THE INVENTION

Limited resources of energy despite the exponentially increasing amount of its demand have forced researchers to explore and use renewable resources of energies, for example, wind energy, solar energy, etc. Among those that convert nature inspired energy to electrical energy, piezoelectric beams, which turn ambient mechanical vibrations into electrical power, are also of great interest. There exist several commercially available devices that are able to convert mechanical pressure into an electric signal, for example, Seiko Kinetic watch, mechanical wind up radios, piezoelectric igniter, etc.

The word 'piezo' is derived from the Greek word for pressure. The piezoelectric effect was discovered in 1880 in an attempt to find out how pressure will turn into electricity. It was noticed when pressure is applied to a quartz crystal, this component acts as an energy transfer function between mechanical and electrical energies. However, later it was found the inverse piezoelectricity effect as an externally applied electrical field was seen to cause deformation in the crystal. This effect greatly contributed to the development of submarine sonars during World War I. The advent of piezoelectric stacks invited a great and growing interest into the subject, so that over a few decades, new piezoelectric materials and applications were developed. Initially, these materials were mostly used as transducers and sensors as they did not have enough energy in the output signal.

In the context of harvesting energy from a vehicle tire, conventionally, piezoelectric beams were placed on the inner surface of a vehicle's tire for energy harvesting. In the case of inner surface attachment, the strain applied to the piezoelectric material is low. This structure had low efficiency and was not feasible for industrial applications. Alternately, piezoelectric beams were positioned on the outer surface of vehicle tire for energy harvesting purpose. This attempted to compensate the low efficiency of piezoelectric beams attached to the inner surface of a vehicle's tire. However, in the case of outer attachment, the piezoelectric stack is damaged and deformed easily. As such, there is a need in the art for a piezoelectric energy harvesting system, which converts energy efficiently and is not damaged or deformed easily.

Additionally, there has not been any approach to transmit the harvested electrical power to the battery with low loss, as it is impossible to connect the harvester unit to the storage battery with a simple conductive wire directly. The reason is that the system power supply, that are tires, are rotating, while the storage unit, that is battery, is fixed in its place. Hence, such a direct wire connection will cause hard twists in the wire around itself and results in the system failure immediately. Traditionally, wireless energy transmission with simple coils and electromagnetic rules to get rid of wires have been suggested. However, the efficiency of wireless transmission is very low and yields to high rate of loss in the system. At least for this reason, there is no commercialized wireless-powered device in a car, whose source of energy is piezoelectric beams mounted in the tire.

Hence, Applicants have identified that there is a long felt, but unresolved need for a piezoelectric energy harvesting system, which converts energy efficiently and is not damaged or deformed easily. Furthermore, there is a need for a piezoelectric energy harvesting system, which efficiently transmits electrical energy to the storage battery with minimum loss. Moreover, there is a need for a piezoelectric energy harvesting system, which is easily installed with little or no changes made to a vehicle or its components.

SUMMARY OF THE INVENTION

The present invention generally relates to the technical field of energy harvesting. More particularly, the present invention concerns with a system and method for extracting power out of moving vehicle tires. More particularly, the present invention relates piezoelectric power harvester stacks, which are placed at the middle of tire layers converting mechanical energy to electrical energy while exposed to mechanical strains. The energy then will be transmitted to the storage circuit or car's battery by an intermediate electrical interface and transmission unit, which is in fact a set of electromechanical devices mounted on the tire.

This summary is provided to introduce a selection of concepts in a simplified form that are further disclosed in the detailed description of the invention. This summary is not intended to identify key or essential inventive concepts of the claimed subject matter, nor is it intended for determining the scope of the claimed subject matter.

The piezoelectric energy harvesting system disclosed herein addresses the above-mentioned need for a piezoelectric energy harvesting system, which converts energy efficiently and is not damaged or deformed easily. Furthermore, the system disclosed herein addresses a need for a piezoelectric energy harvesting system, which efficiently transmits electrical energy to the storage battery with minimum loss. Moreover, the system disclosed herein addresses a need for a piezoelectric energy harvesting system, which is easily installed with little or no changes made to a vehicle or its components. Additionally, the system disclosed herein addresses a need for a piezoelectric energy harvesting system, which is composed of both electrical and mechanical components uniformly connected together to handle the power harvesting task efficiently. The piezoelectric energy harvesting system for converting mechanical energy of a tire of a vehicle to electrical energy for powering components of the vehicle comprises sets of piezoelectric beam assemblies, a tire electrical jack, a conductive bearing, and an electrical storage unit. The sets of piezoelectric beam assemblies are embedded in the tire of the vehicle and electrically connected in a parallel configuration. Each of the sets of the piezoelectric beam assemblies comprise piezoelectric beam assemblies electrically connected in a series configuration for converting mechanical strains on the piezoelectric beam assemblies to electrical energy. Each of the piezoelectric beam assemblies comprise at least two output terminals for transmitting the generated electrical energy. The tire electrical jack is mounted on a rim of the tire and electrically connected to the two output terminals of the sets of the piezoelectric beam assemblies. The tire electrical jack receives the electrical energy generated by the sets of piezoelectric beams. The conductive bearing is operably connected to the tire electrical jack to transmit the electrical energy received by the tire electrical jack to the electrical storage unit. The electrical storage unit is configured to store the electrical energy transmitted by the conductive bearing. Furthermore, the electrical storage unit filters and rectifies the transmitted electrical energy for powering components of the vehicle.

The proposed system provides a scheme for harvesting electrical energy from moving vehicle tire and supplying electrical power consuming devices in the car. In this framework, the current invention proposes a method for energy harvesting in vehicle's tires by mounting piezoelectric stacks between the tire layers. Furthermore, this invention presents a wire-based energy transmission system to protect and save the scavenged power from tire while efficiently passing it to the storage unit. The energy resource is a set of piezoelectric beams, which is connected in a serial-parallel discipline. In accordance with particular aspects of the disclosed invention, one aspect of the present subject matter is the insulation of the piezoelectric beam assemblies in the tire and insulation of the tire electrical jack. The conductive wire will play an essential role in transmission of the energy; hence, it needs to be protected as it is subject to the ambient physical tensions due to the road conditions. Furthermore, the temperature will negatively affect the system's efficiency as it has an inverse relation with conductivity. Hence, an appropriate wire insulation is required. Fluorinated Ethylene Propylene (FEP) insulation is appropriate for this purpose. Energy loss is not merely in the conductive wire and it can occur in the tire electrical jack and the conductive bearing. To avoid energy loss in the tire electrical jack, Ethylene Propylene Rubber (EPR) insulation is used over the jack. Conductive grease is applied to grooves and between the ball bearings of the conductive bearing to prevent energy leakage.

One aspect of the present disclosure is directed to a piezoelectric energy harvesting system for converting mechanical energy of a tire of a vehicle to electrical energy for powering components of the vehicle. The piezoelectric energy harvesting system comprises: a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assemblies comprises at least two output terminals for transmitting the generated electrical energy; a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams; a conductive bearing operably connected to the tire electrical jack to transmit the electrical energy received by the tire electrical jack to an electrical storage unit; and the electrical storage unit configured to store the electrical energy transmitted by the conductive bearing, wherein the electrical storage unit is further configured to filter and rectify the transmitted electrical energy for powering components of the vehicle.

In one embodiment of the piezoelectric energy harvesting system, the piezoelectric beams are of a generally rectangular geometric configuration. In another embodiment, the piezoelectric beams further comprise a fiberglass layer and an insulation layer. In one embodiment, the tire electrical jack comprises: input terminals for receiving the generated electrical energy from the output terminals of the sets of piezoelectric beams, wherein the input terminals are electrically separated by an insulation layer; output terminals electrically connected to the input terminals for transferring the electrical energy to the conductive bearing, wherein the output terminals are electrically separated by an insulation layer; and a housing configured to accommodate the input terminals, the insulation layer, and the output terminals, wherein the housing is seated in the rim of the tire, and wherein the housing is insulated on an external surface of the housing.

In one embodiment of the piezoelectric energy harvesting system, the tire electrical jack rotates integrally with the rim of the tire. In another embodiment, of the piezoelectric energy harvesting system, the electrical storage unit comprises: A) a regulation unit for filtering, rectifying, and adapting the electrical energy transmitted by the conductive bearing, the regulation unit comprising: 1) a low pass filter; 2) a rectifier; and 3) a buck converter; and B) a battery for storing the regulated electrical energy received from the regulation unit for powering components of the vehicle. In another embodiment, the rectifier is a bridge-wave rectifier.

One aspect of the present disclosure is a piezoelectric energy harvesting system for converting mechanical energy of a tire of a vehicle to electrical energy for powering components of the vehicle, the piezoelectric energy harvesting system comprising: 1) a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assembly comprises at least two output terminals for transmitting the generated electrical energy; 2) a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams, the tire electrical jack comprising: a) input terminals for receiving the generated electrical energy from the output terminals of the sets of piezoelectric beams, wherein the input terminals are electrically separated by an insulation layer; b) output terminals electrically connected to the input terminals for transferring the electrical energy to the conductive bearing, wherein the output terminals are electrically separated by an insulation layer; and c) a housing configured to accommodate the input terminals, the insulation layer, and the output terminals, wherein the housing is seated in the rim of the tire, and wherein the housing is insulated on an external surface of the housing; 3) a conductive bearing operably connected to the tire electrical jack to transmit the electrical energy received by the tire electrical jack to an electrical storage unit; and 4) the electrical storage unit configured to store the electrical energy transmitted by the conductive bearing, wherein the electrical storage unit is further configured to filter and rectify the transmitted electrical energy for powering components of the vehicle, wherein the electrical storage unit comprises: a regulation unit for filtering, rectifying, and adapting the electrical energy transmitted by the conductive bearing, the regulation unit comprising: a low pass filter; a rectifier; a buck converter; and a battery for storing the regulated electrical energy received from the regulation unit for powering components of the vehicle.

In one embodiment of the piezoelectric energy harvesting system, the piezoelectric beams are of a generally rectangular geometric configuration. In another embodiment of the piezoelectric energy harvesting system, the piezoelectric beams further comprise a fiberglass layer and an insulation layer. In one embodiment, the tire electrical jack rotates integrally with the rim of the tire.

In one embodiment of the piezoelectric energy harvesting system, the conductive bearing comprises: an inner ring operably engaged to the rim of the vehicle and configured to rotate with the rim; at least two input pins seated in an inner ring for receiving an input signal from the tire electrical jack mounted on the rim, the at least two input pins separated by an insulation layer, wherein the at least two input pins are configured to engageably contact at least two ball bearings; an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins; and the at least two output pins are seated in the outer ring and configured to engageably contact the at least two ball bearings for transmitting the input signal received from the at least two ball bearings to the electrical storage unit, wherein the at least two output pins are separated by an insulation layer. In another embodiment, the rectifier is a bridge-wave rectifier.

Another aspect of the present disclosure is directed to a piezoelectric energy harvesting system for converting mechanical energy of a tire of a vehicle to electrical energy for powering components of the vehicle, the piezoelectric energy harvesting system comprising: 1) a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assemblies comprises at least two output terminals for transmitting the generated electrical energy; 2) a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams, the tire electrical jack comprising: a) input terminals for receiving the generated electrical energy from the output terminals of the sets of piezoelectric beams, wherein the input terminals are electrically separated by an insulation layer; b) output terminals electrically connected to the input terminals for transferring the electrical energy to the conductive bearing, wherein the output terminals are electrically separated by an insulation layer; and c) a housing configured to accommodate the input terminals, the insulation layer, and the output terminals, wherein the housing is seated in the rim of the tire, and wherein the housing is insulated on an external surface of the housing; 3) a conductive bearing operably connected to the tire electrical jack to transmit the electrical energy received by the tire electrical jack to an electrical storage unit, the conductive bearing comprising: a) an inner ring operably engaged to the rim of the vehicle and configured to rotate with the rim; b) at least two input pins seated in an inner ring for receiving an input signal from the tire electrical jack mounted on the rim, the at least two input pins separated by an insulation layer, wherein the at least two input pins are configured to engageably contact at least two ball bearings; c) an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins; d) the at least two output pins seated in the outer ring and configured to engageably contact the at least two ball bearings for transmitting the input signal received from the at least two ball bearings to the electrical storage unit, wherein the at least two output pins are separated by an insulation layer; and e) the electrical storage unit configured to store the electrical energy transmitted by the conductive bearing, wherein the electrical storage unit is further configured to filter and rectify the transmitted electrical energy for powering components of the vehicle, wherein the electrical storage unit comprises a regulation unit for filtering, rectifying, and adapting the electrical energy transmitted by the conductive bearing, the regulation unit comprising: a low pass filter; a rectifier; a buck converter; and a battery for storing the regulated electrical energy received from the regulation unit for powering components of the vehicle.

In one embodiment, the piezoelectric beams are of a generally rectangular geometric configuration. In another embodiment, the piezoelectric beams further comprise a fiberglass layer and an insulation layer. In one embodiment, the tire electrical jack rotates integrally with the rim of the tire. In another embodiment, the rectifier is a bridge-wave rectifier.

Other objects, features and advantages of the present invention will become apparent from the following detailed description. It should be understood, however, that the detailed description and the specific examples, while indicating specific embodiments of the invention, are given by way of illustration only, since various changes and modifications within the spirit and scope of the invention will become apparent to those skilled in the art from this detailed description.

BRIEF DESCRIPTION OF DRAWINGS

The foregoing summary, as well as the following detailed description of the invention, is better understood when read in conjunction with the appended drawings. For the purpose of illustrating the invention, exemplary constructions of the invention are shown in the drawings. However, the invention is not limited to the specific methods and structures disclosed herein. The description of a method step or a structure referenced by a numeral in a drawing is applicable to the description of that method step or structure shown by that same numeral in any subsequent drawing herein.

FIG. 8A exemplarily illustrates a perspective view of a tire rim showing a tire electrical jack mounted on the tire rim.

FIG. 8B exemplarily illustrates an enlarged view of a tire electrical jack mounted on a tire rim.

DETAILED DESCRIPTION

Figure 1:
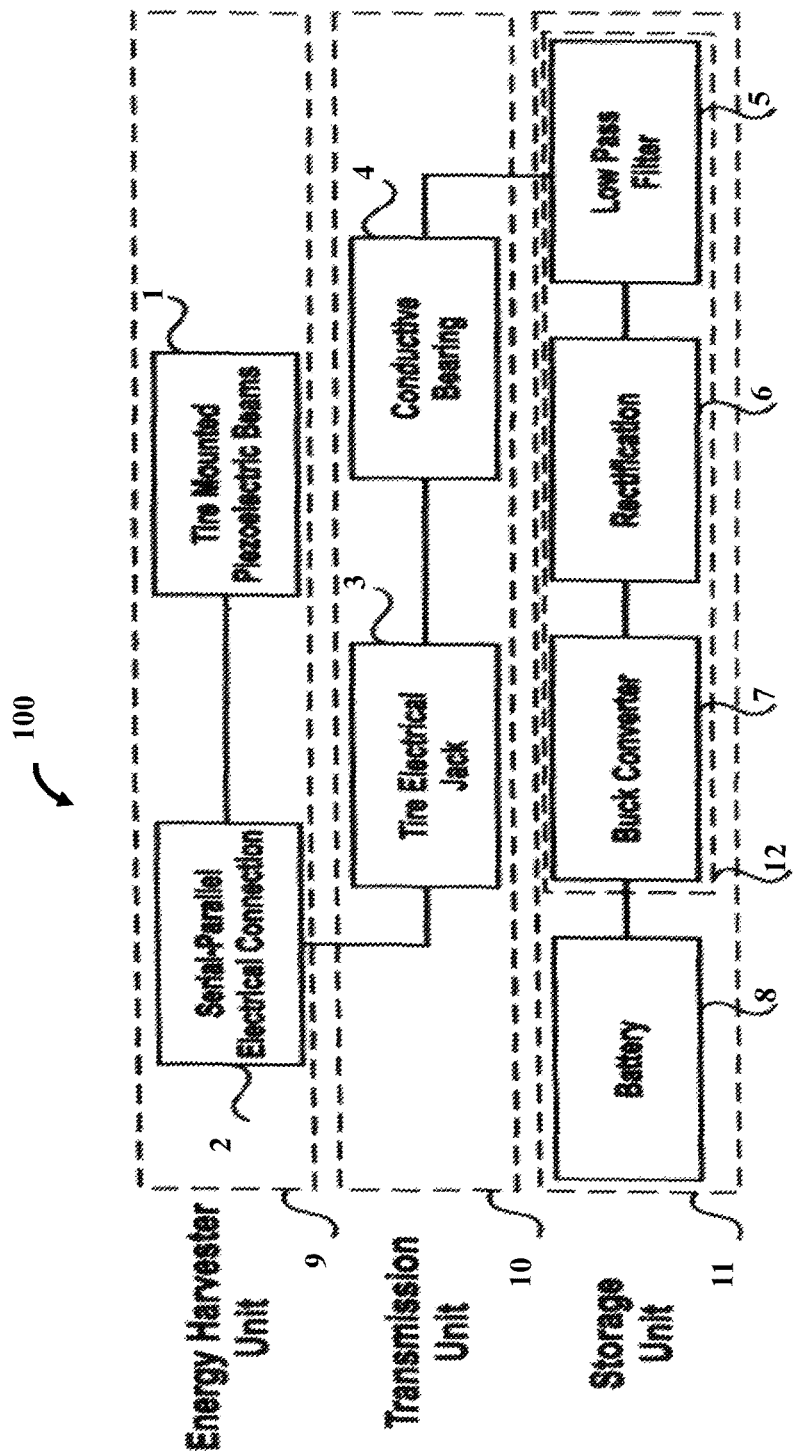
FIG. 1 exemplarily illustrates a block diagram of the power harvesting system.

A description of embodiments of the present invention will now be given with reference to the Figures. It is expected that the present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

In the context of harvesting energy from a vehicle tire, conventionally, piezoelectric beams were placed on the inner surface of a vehicle's tire for energy harvesting. In the case of inner surface attachment, the strain applied to the piezoelectric material is low. This structure had low efficiency and was not feasible for industrial application. Alternately, piezoelectric beams were positioned on the outer surface of vehicle tire for energy harvesting purpose. This attempted to compensate the low efficiency of piezoelectric beams attached to the inner surface of a vehicle's tire. However, in the case of outer attachment, the piezoelectric stack is damaged and deformed easily. As such, there is a need in the art for a piezoelectric energy harvesting system, which converts energy efficiently and is not damaged or deformed easily.

Additionally, there has not been any approach to transmit the harvested electrical power to the battery with low loss, as it is impossible to connect the harvester unit to the storage battery with a simple conductive wire directly. The reason is that the system power supply, that are rotating tires, while the storage unit, that is battery, is fixed in its place. Hence, such a direct wire connection will cause hard twists in the wire around itself and results in the system failure immediately. Traditionally, wireless energy transmission with simple coils and electromagnetic rules to get rid of wires have been suggested. However, the efficiency of wireless transmission is very low and yields to high rate of loss in the system. For this reason, there is no commercialized wireless-powered device in a car, whose source of energy is piezoelectric beams mounted in the tire. A piezoelectric energy harvesting system, which efficiently transmits electrical energy to the storage battery with minimum loss, is required.

Furthermore, existing systems are not adaptive in nature. That is, existing energy harvesting systems require major changes to be made to the vehicle for installation. This is not feasible for different makes of vehicles, as individual changes have to be made to the vehicle for installation of the energy harvesting system. Additionally, existing systems are not mountable on different types of tires, for example, tubeless tires, etc. A piezoelectric energy harvesting system, which is easily installed with little or no changes made to a vehicle or its components, is required. Moreover, conventional energy harvesting systems have focused on pure mechanical or mere electrical points of view. Some investigated the piezoelectric mechanical features and others surveyed electrical circuits. Both mechanical and electrical approaches have individual advantages. A piezoelectric energy harvesting system, which is composed of both electrical and mechanical components uniformly connected together to handle the power harvesting task efficiently, is required.

FIG. 1 exemplarily illustrates a block diagram of a power harvesting system 100. The process is implemented by application of sets of piezoelectric beams mounted between tire 56 layers to charge the battery 8 when tire 56 rotates (see also FIG. 7D). The scavenged electrical power is transferred through a transmission unit 10 via the tire electrical jack 3 and conductive bearing 4 to reach the storage unit 11. The stored energy is used to power electrical components of the vehicle. The energy harvester unit 9 comprises the piezoelectric beams connected in a series configuration 2 to form a set. Each set is electrically connected to the other sets via a parallel configuration 2. As exemplarily illustrated in FIG. 1, the energy harvesting process begins from the tire mounted piezoelectric beams 1. The sets of piezoelectric beam assemblies 18 have a serial-parallel structure in which the piezoelectric beam assemblies 18 are electrically connected by Fluorinated Ethylene Propylene (FEP) insulated wires.

The piezoelectric beam assemblies 18 with series-parallel configuration are embedded in the tire 56. Per each piezoelectric beam assembly 18, there are two outputs denoting the voltage polarities of the piezoelectric beam assembly 18. All piezoelectric outputs will be gathered into two sets of conductive wires 19 to enter the tire electrical jack 3. The tire electrical jack 3 rotates with the same angular velocity of tire 56 and so it cannot be directly connected to the storage unit 11 as the battery 8 is firmly fixed. Thus, the transmission unit 10 requires another component to convert the angular motion of wire into fixed state while passing the electrical power with minimum loss. This component is the conductive bearing 4 which is a double row deep groove bearing filled with conductive grease. The electrical output of the conductive bearing 4, which is the last part of transmission unit 10, goes to storage unit 11. The storage unit 11 comprises a regulation unit 12 and a battery 8. The regulation unit 12 comprises a low pass filter 5, a rectifier 6, and a voltage step down and current step up converter, that is, a buck converter 7.

The harvested electric power signal cannot be directly connected to the battery 8 and some regulation of the electric power signal is needed. The regulation unit 12 regulates the electric power signal as required. The electric power signal contains additional interfering noise signals due to ambient mechanical vibrations. As noise signals mostly occur in high frequencies, the regulation unit 12 starts with a low pass filter 5. Following noise filtering, the electric power signal is rectified in a rectifier 6, for example, a bridge-wave rectifier, etc. The rectified electrical power signal is transmitted to the buck converter 7 for further manipulations before transferring the electrical energy to the battery 8.

The buck converter 7 is a current step up and voltage step down converter. The output signal of the buck converter 7, for example, an acceptably clean signal for storage will enter the battery 8. The output signal of regulation unit 12 is guided to the battery 8 for storage. The battery 8 used herein can be vehicle's battery or a side-mounted Lithium-ion type rechargeable battery. Losses of generated electrical energy are curbed as the piezoelectric energy harvesting system 100 adds negligible loads to the vehicle's motor due to the proper placement of piezoelectric beam assemblies 18.

In order to reduce additional losses of the harvested energy due to ambient conditions, such as high temperature, the piezoelectric energy harvesting system 100 is electrically and mechanically insulated. Furthermore, the piezoelectric energy harvesting system 100 has been designed independent of vehicle's structure and can be installed on various types of cars. Vehicles usually move in a wide range of speeds. The piezoelectric energy harvesting system 100 has been designed to work in a wide range of vibration frequencies to be efficient in most of the vehicle's speeds. This mechanism can be considered for all types of tires either with tube or for tubeless ones as the piezoelectric beam assemblies 18 are mounted between layers of tires 56. This feature helps to use the most of power harvesting capability and leads to higher system efficiency. This characteristic also extends the range of use to all types of tires and contributes to system practicability.

It is worth mentioning that the design for the regulation unit 12 depends on the system specifications such as power rate and number of mounted piezoelectric sets that affect the output voltage directly. For this purpose, all presented circuits possess the flexibility in design so that they can be used and matched with diverse harvesting sets.

One aspect of the present disclosure is directed to a piezoelectric energy harvesting system for converting mechanical energy of a tire of a vehicle to electrical energy for powering components of the vehicle. The piezoelectric energy harvesting system comprises a plurality of sets of piezoelectric beam assemblies embedded in the tire of the vehicle. These assemblies may be electrically connected in a parallel configuration, such that each of the sets of the piezoelectric beam assemblies comprise a plurality of piezoelectric beam assemblies. The piezoelectric beam assemblies may be electrically connected in a series configuration for converting mechanical strains on the piezoelectric beam assemblies to electrical energy, and such that each of the piezoelectric beam assemblies comprises at least two output terminals for transmitting the generated electrical energy.

The piezoelectric energy harvesting system may further comprise a tire electrical jack mounted on a rim of the tire. The tire electrical jack may be electrically connected to the at least two output terminals of the sets of the piezoelectric beam assemblies, such that the tire electrical jack receives the electrical energy generated by the sets of piezoelectric beams. The piezoelectric energy harvesting system may further comprise a conductive bearing operably connected to the tire electrical jack to transmit the electrical energy received by the tire electrical jack to an electrical storage unit. This electrical storage unit is, in one example, configured to store the electrical energy transmitted by the conductive bearing. The electrical storage unit may further be configured to filter and rectify the transmitted electrical energy for powering components of the vehicle.

Figure 2:
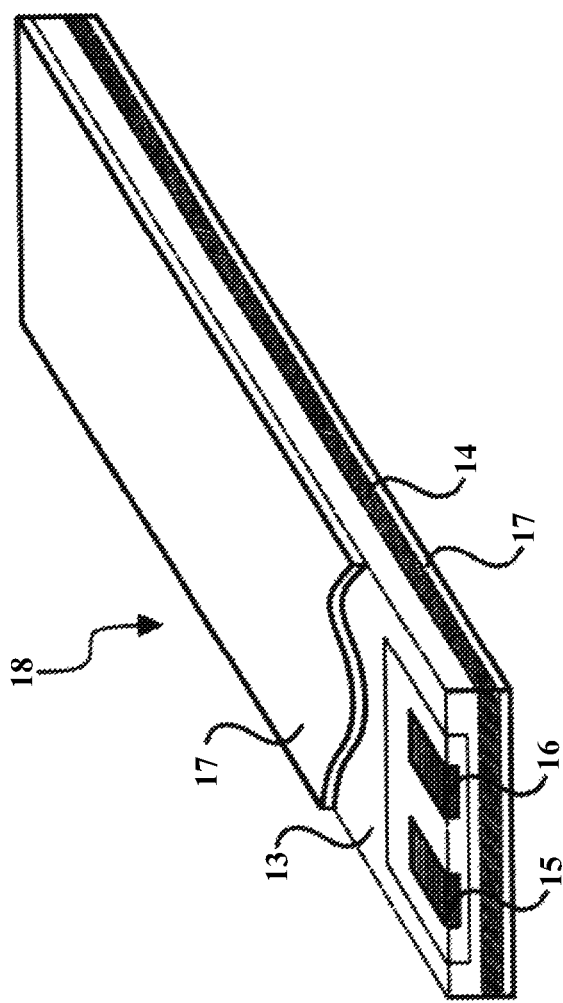
FIG. 2 exemplarily illustrates a top perspective view of a piezoelectric beam assembly.

FIG. 2 exemplarily illustrates a top perspective view of a piezoelectric beam assembly 18. The piezoelectric beam 13 in FIG. 2 needs insulation and protection from pressure and temperature. Various materials are suitable for the insulation layer 17, for example, a layer of elastomer. The material used herein is also elastomer, which can tolerate various working conditions, for example, temperature, pressure, etc. The piezoelectric beam 13 comprises output terminals 15 and 16. The output terminals 15 and 16 of the piezoelectric beam assembly 18 are connected along with the rest of the piezoelectric beam assembly 13 in a series-parallel array to the tire electrical jack 3. Furthermore, the piezoelectric beam 13 is attached to a substrate layer 14. The overall piezoelectric beam assembly 18 has a thickness of about less than 0.5 mm. The materials are all selected properly with respect to the ambient conditions. Moreover, the conductive wires 19 used in the piezoelectric energy harvesting system 100 are made of copper, which has 100% conductivity based on the International Association of Classification Societies (IACS) index to effectively decrease electrical losses in the piezoelectric energy harvesting system 100. In addition to the conductive wire 19, the conductive bearing 4 is filled with conductive anti-spark grease as exemplarily illustrated in FIG. 6A. This decreases losses in the piezoelectric energy harvesting system 100 and increases the conductivity.

Figure 3:
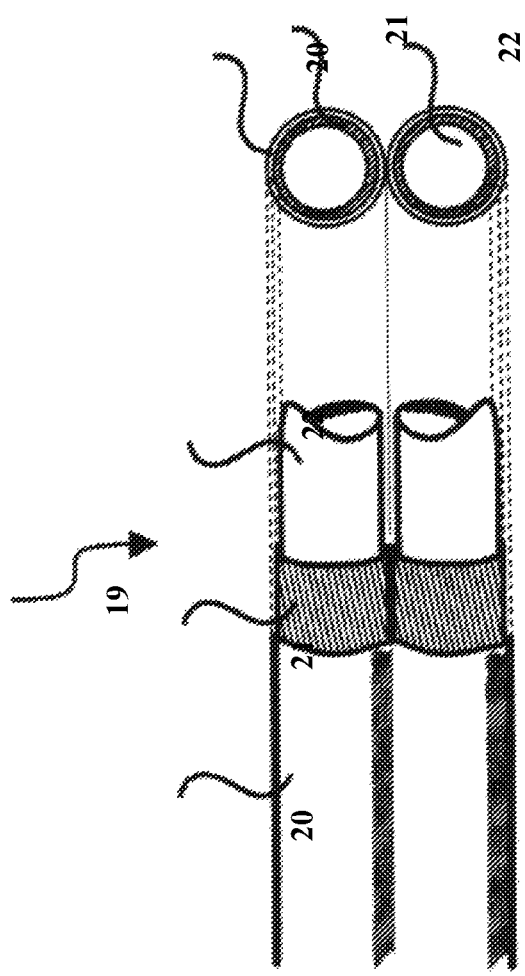
FIG. 3 exemplarily illustrates a side view and a top view of a conductive wire structure.

FIG. 3 exemplarily illustrates a side view and a top view of a conductive wire 19 structure. The conductive wire 19 comprises a copper core 22, a middle shield 21, and an insulation layer 20. In an embodiment, the insulation layer 20 is, for example, Fluorinated Ethylene Propylene (FEP). The proper material selection of the insulation layer 20 plays an important role in minimization of the total loss in the piezoelectric energy harvesting system 100.

Figure 4:
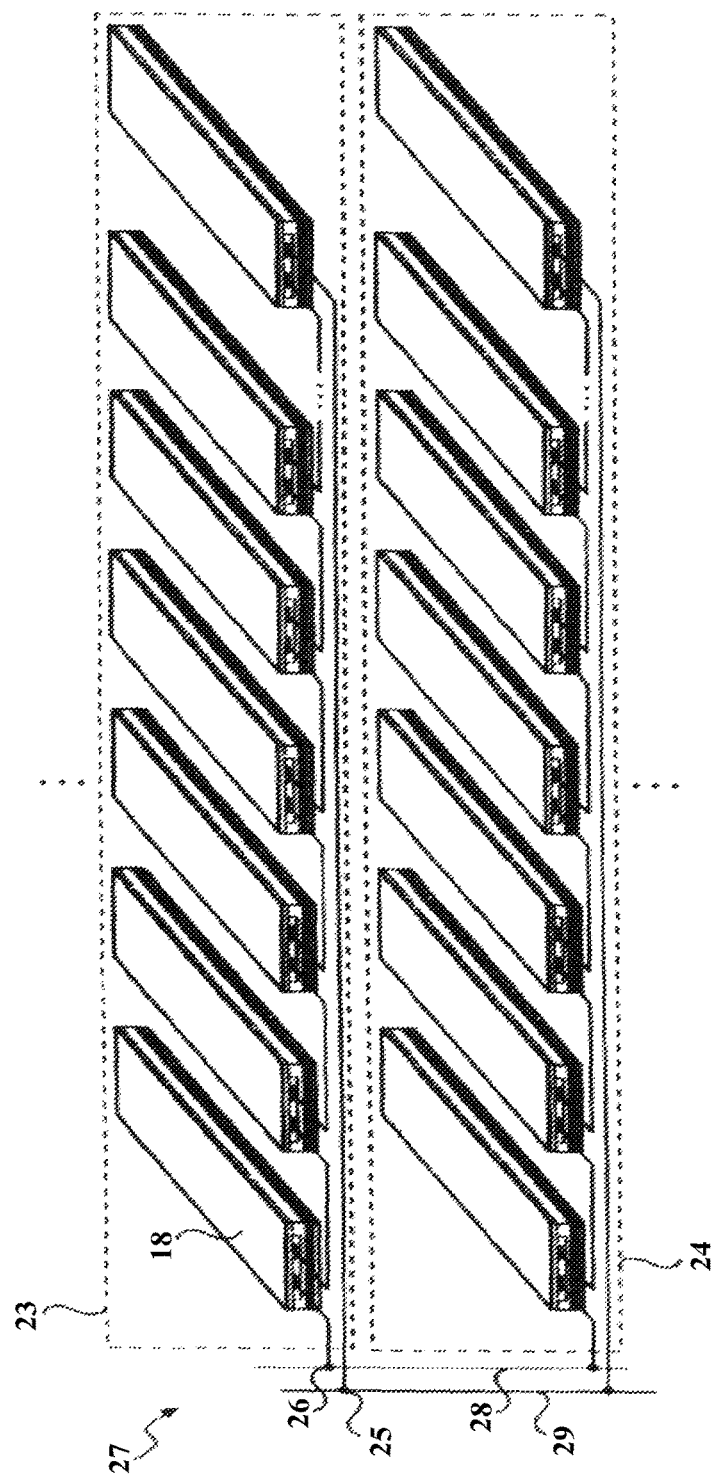
FIG. 4 exemplarily illustrates a series and a parallel configuration of sets of the piezoelectric beam assemblies.

FIG. 4 exemplarily illustrates a series and a parallel configuration of sets of the piezoelectric beam assemblies 18. The electrical connection of piezoelectric beam assembly 18 sets, which are considered as electrical power generators for the piezoelectric energy harvesting system 100, is also important. Different strategies of electrical connection are used for this purpose. In an embodiment, the piezoelectric beam assembly 18 sets are connected in series. In series configuration, if the conductive wire 19 is cut away or piezoelectric beam assembly 18 is ruined, high impedance occurs in the circuit and hence, no current will flow into the circuit. In this situation, no energy is transferred. Based upon this fact, series configuration is not the suitable choice for this purpose as it lacks the robustness for the unknown ambient conditions. In another embodiment, parallel configuration of the sets of piezoelectric beam assembly 18 are used to manage the task. In parallel configuration, each piezoelectric beam assembly 18 is uniquely separated from the other piezoelectric beam assembly 18, and if one is ruined, the rest continue power harvesting normally. In this embodiment, the voltage level is significantly lower in comparison with the series configuration. This reduces the performance while increases the rate of loss over the generated power of the piezoelectric energy harvesting system 100.

In another embodiment disclosed herein, a hybrid series-parallel configuration is adopted to harvest energy as exemplarily illustrated in FIG. 4. This configuration over the piezoelectric network 27 within the tire 56 is exemplarily illustrated in FIG. 4. In the embodiment, several sets 23 and 24 of piezoelectric beam assemblies 18 that are electrically connected together in parallel while each set comprises the piezoelectric beam assemblies 18 electrically connected in series. Each set of piezoelectric beam assemblies 18, for example, 23, have their output terminals 15 and 16 connected to common lines 28 and 29 within the knots 25 and 26 as exemplarily illustrated in FIG. 4. This hybrid configuration implements a compromise between the series and parallel configurations and incorporates the advantages of both configurations.

The piezoelectric beams may be of a generally rectangular geometric configuration. The piezoelectric beams may further comprise a fiberglass layer and an insulation layer. The tire electrical jack may comprise one or more input terminals for receiving the generated electrical energy from the output terminals of the sets of piezoelectric beams. The input terminals may be electrically separated by an insulation layer. The tire electrical jack may further comprise output terminals electrically connected to the input terminals of the conductive bearing for transferring the electrical energy, wherein the output terminals are electrically separated by an insulation layer. The tire electrical jack may further comprise a housing configured to accommodate the input terminals, the insulation layer, and the output terminals, wherein the housing is seated in the rim of the tire, and wherein the housing is insulated on an external surface of the housing. The tire electrical jack may rotate integrally with the rim of the tire.

The electrical storage unit may comprise A) a regulation unit for filtering, rectifying, and adapting the electrical energy transmitted by the conductive bearing. The regulation unit may comprise 1) a low pass filter; 2) a rectifier; and 3) a buck converter. The electrical storage unit may further comprise B) a battery for storing the regulated electrical energy received from the regulation unit for powering components of the vehicle. The rectifier may be a bridge-wave rectifier.

Figure 5A:
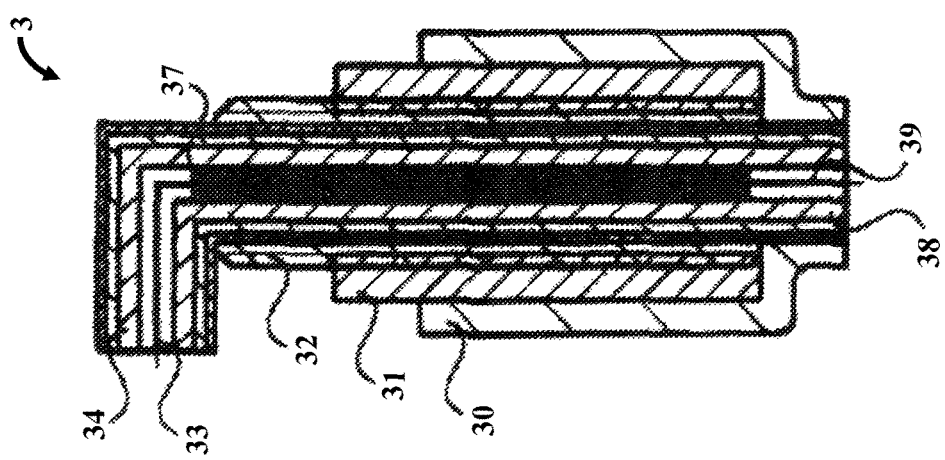
FIG. 5A exemplarily illustrates a cut away sectional view of a tire electrical jack.
Figure 5B:
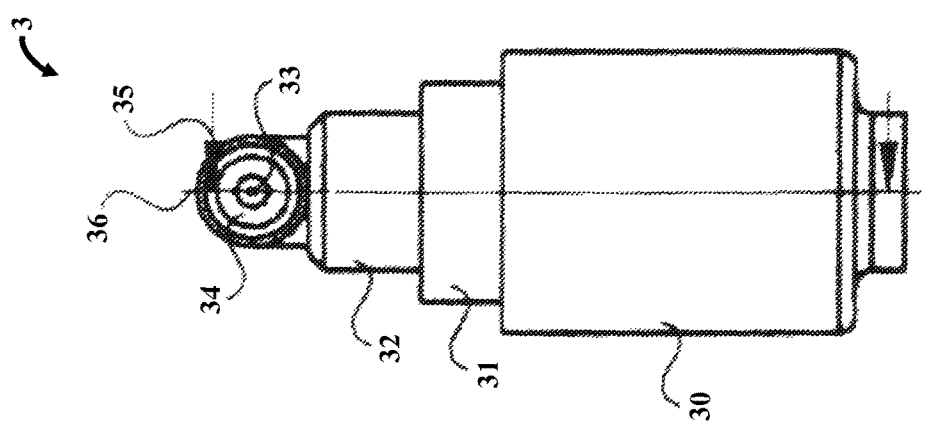
FIG. 5B exemplarily illustrates a front elevation view of a tire electrical jack.
Figure 5C:
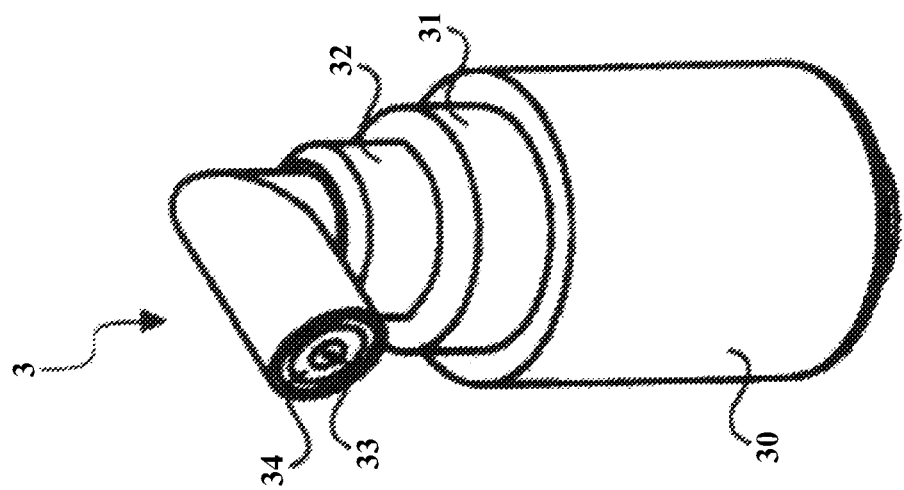
FIG. 5C exemplarily illustrates a top perspective view of a tire electrical jack.

FIG. 5A exemplarily illustrates a cut away sectional view of a tire electrical jack 3 about the line 36 pointed by 35 as exemplarily illustrated in FIG. 5B. FIG. 5B exemplarily illustrates a front elevation view of a tire electrical jack 3. FIG. 5C exemplarily illustrates a top perspective view of a tire electrical jack 3. The output of the series-parallel configuration, that is, a pair of conductive wires 19 is connected to the tire electrical jack 3 via input terminals 33 and 34 as exemplarily illustrated in FIGS. 5A-5C. In the same figure, the tire electrical jack 3 is insulated by 30 and protected by body 31 and 32. The input terminals 33 and 34 of the tire electrical jack 3 are insulated by the insulating layer 37 and extend to the output terminals 38 and 39 where they are connected to the conductive bearing 4. The tire electrical jack 3 passes electrical power through the tire rim. The harvested electrical power reaches the conductive bearing 4 through the output terminals 38 and 39 of the tire electrical jack 3. As tire electrical jack 3 is mounted on the tire rim, it rotates with the speed of the tire 56. On the other hand, the battery 8 is fixed and hence, the tire electrical jack 3, which carries the harvested energy, is not directly connected to the vehicle's battery 8. In such a case, a unique class of bearings, that is, a conductive bearing 4, exemplarily illustrated in FIGS. 6A-6B, is used.

Figures 6A, 6B:
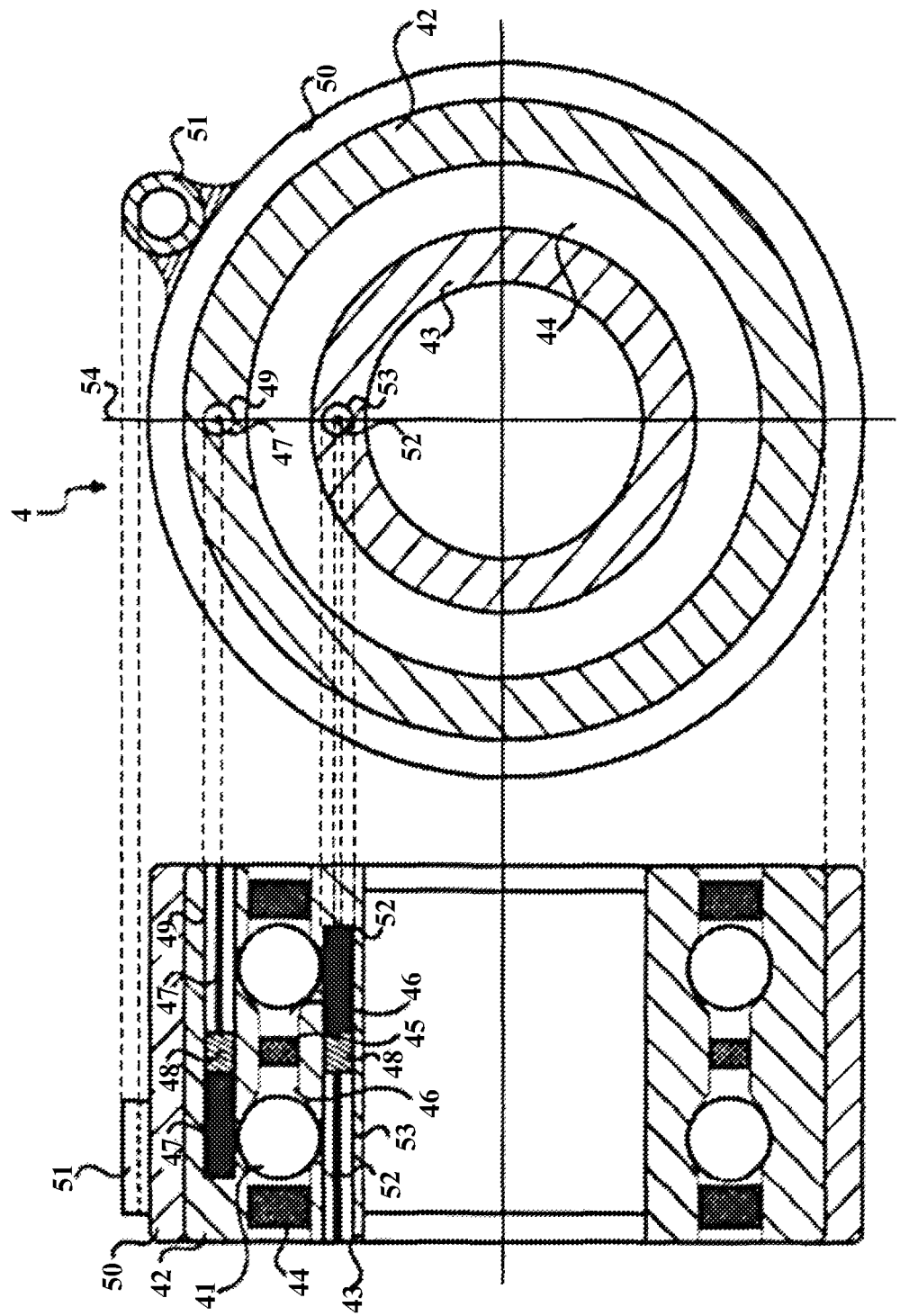
FIG. 6A exemplarily illustrates a front sectional view of a conductive bearing.
FIG. 6B exemplarily illustrates a right side view of a conductive bearing.

FIG. 6A exemplarily illustrates a front sectional view of a conductive bearing 4 taken about a line 54 exemplarily illustrated in FIG. 6B. FIG. 6B exemplarily illustrates a right side view of a conductive bearing 4. In an embodiment, the conductive bearing 4 comprises two rings, for example, an inner ring 43 and an outer ring 42 filled with ball bearings 41 and sided by wall 44 in which this set is placed within the bearing housing 50 fixed to the disk brake with a nut and screw. The inner ring 43 rotates with the speed of tire 56 and receives the input signal from the tire electrical jack 3 and the outer ring 42 that is fixed on the bearing housing 50 is connected to the battery 8 via insulated conductive wire 19. The bearing housing 50 is fixed to the vehicle via an attachment member 51. The space 46 is fully filled with conductive grease separated by a central wall 45 to avoid direct contact of polarities. The input signal from the tire electrical jack 3 enters the conductive bearing 4 via input pins 52 and 53 insulated by an insulation layer 48. The signal then travels to output pins 47 and 49 by surface contact with the ball bearings 41. This signal would be available via output pins 47 and 49 as exemplarily illustrated in FIGS. 6A-6B.

Another aspect of the present disclosure is directed to a piezoelectric energy harvesting system for converting mechanical energy of a tire of a vehicle to electrical energy for powering components of the vehicle. The piezoelectric energy harvesting system comprises a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assemblies comprises at least two output terminals for transmitting the generated electrical energy.

The piezoelectric energy harvesting system may further comprise a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams, the tire electrical jack comprising: a) input terminals for receiving the generated electrical energy from the output terminals of the sets of piezoelectric beams, wherein the input terminals are electrically separated by an insulation layer; b) output terminals electrically connected to the input terminals for transferring the electrical energy to the conductive bearing, wherein the output terminals are electrically separated by an insulation layer; and c) a housing configured to accommodate the input terminals, the insulation layer, and the output terminals, wherein the housing is seated in the rim of the tire, and wherein the housing is insulated on an external surface of the housing.

The piezoelectric energy harvesting system may further comprise a conductive bearing operably connected to the tire electrical jack to transmit the electrical energy received by the tire electrical jack to an electrical storage unit.

The conductive bearing may comprise a) an inner ring operably engaged to the rim of the vehicle and configured to rotate with the rim; b) at least two input pins seated in an inner ring for receiving an input signal from the tire electrical jack mounted on the rim, the at least two input pins separated by an insulation layer, wherein the at least two input pins are configured to engageably contact at least two ball bearings; c) an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins; d) the at least two output pins seated in the outer ring and configured to engageably contact the at least two ball bearings for transmitting the input signal received from the at least two ball bearings to the electrical storage unit, wherein the at least two output pins are separated by an insulation layer; and e) the electrical storage unit configured to store the electrical energy transmitted by the conductive bearing, wherein the electrical storage unit is further configured to filter and rectify the transmitted electrical energy for powering components of the vehicle, wherein the electrical storage unit comprises a regulation unit for filtering, rectifying, and adapting the electrical energy transmitted by the conductive bearing, the regulation unit comprising: a low pass filter; a rectifier; a buck converter; and a battery for storing the regulated electrical energy received from the regulation unit for powering components of the vehicle.

One aspect of the present disclosure is a piezoelectric energy harvesting system for converting mechanical energy of a tire of a vehicle to electrical energy for powering components of the vehicle. The piezoelectric energy harvesting system may comprise a plurality of sets of piezoelectric beam assemblies embedded in the tire of the vehicle and electrically connected in a parallel configuration. In such a configuration, for example, each of the sets of the piezoelectric beam assemblies may comprise a plurality of piezoelectric beam assemblies. The piezoelectric beam assemblies may be electrically connected in a series configuration for converting mechanical strains on the piezoelectric beam assemblies to electrical energy. The piezoelectric beam assemblies may comprise at least two output terminals for transmitting the generated electrical energy.

The piezoelectric energy harvesting system may further comprise a conductive bearing operably connected to the tire electrical jack to transmit the electrical energy received by the tire electrical jack to an electrical storage unit. In addition, the electrical storage unit may be configured to store the electrical energy transmitted by the conductive bearing. The electrical storage unit may further be configured to filter and rectify the transmitted electrical energy for powering components of the vehicle. The electrical storage unit may comprise a regulation unit for filtering, rectifying, and adapting the electrical energy transmitted by the conductive bearing, the regulation unit comprising: a low pass filter; a rectifier; a buck converter; and a battery for storing the regulated electrical energy received from the regulation unit for powering components of the vehicle. In one example, the piezoelectric beams further comprise a fiberglass layer and an insulation layer. The tire electrical jack can rotate integrally with the rim of the tire.

The conductive bearing may comprise an inner ring operably engaged to the rim of the vehicle and configured to rotate with the rim. The conductive bearing may further comprise at least two input pins seated in an inner ring for receiving an input signal from the tire electrical jack mounted on the rim, the at least two input pins separated by an insulation layer, wherein the at least two input pins are configured to engageably contact at least two ball bearings. In addition, the conductive bearing may further comprise an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins. The conductive bearing may further comprise the at least two output pins seated in the outer ring and configured to engageably contact the at least two ball bearings for transmitting the input signal received from the at least two ball bearings to the electrical storage unit, wherein the at least two output pins are separated by an insulation layer. The rectifier may be a bridge-wave rectifier.

Figure 7A:
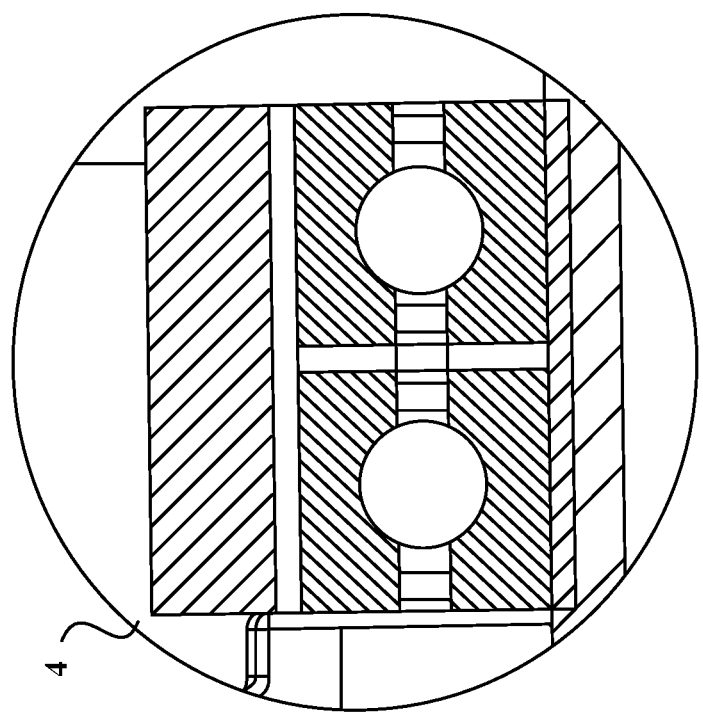
FIG. 7A exemplarily illustrates an enlarged sectional view of a conductive bearing.
Figure 7B:
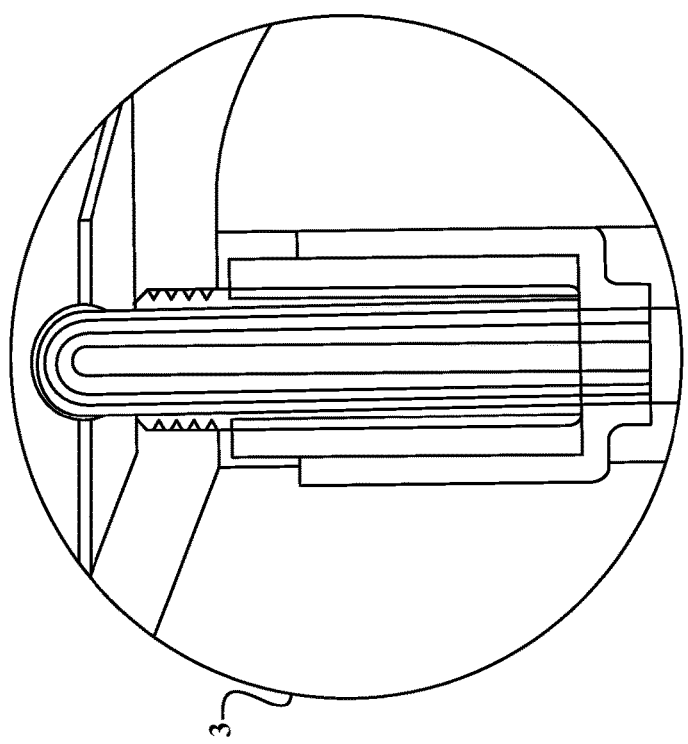
FIG. 7B exemplarily illustrates an enlarged sectional view of a tire electrical jack.
Figure 7D:
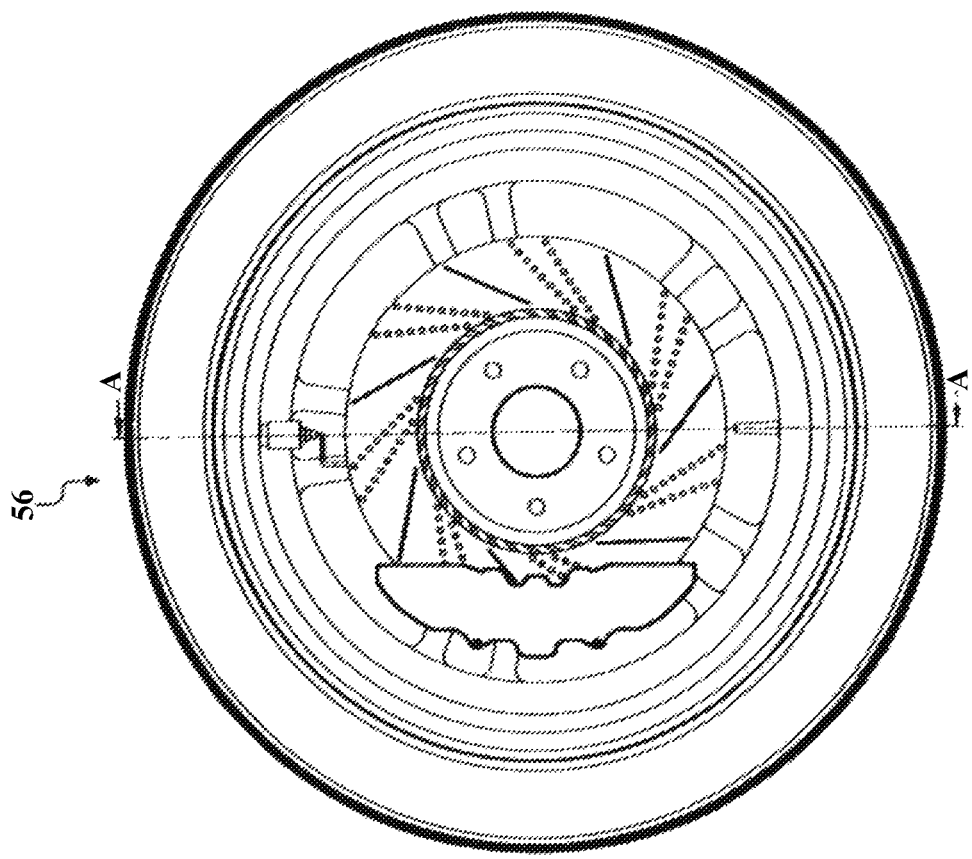
FIG. 7D exemplarily illustrates a right side view of a tire assembly.
Figure 7C:
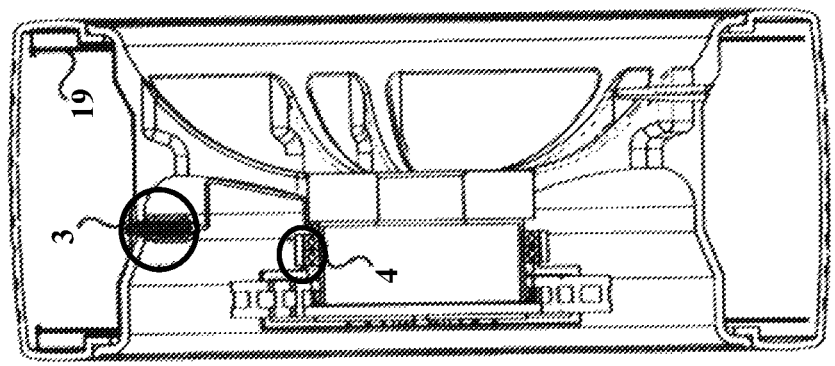
FIG. 7C exemplarily illustrates a front sectional view of a tire assembly.

FIG. 7A exemplarily illustrates an enlarged sectional view of a conductive bearing 4 about A-A exemplarily illustrated in FIG. 7D. FIG. 7B exemplarily illustrates an enlarged sectional view of a tire electrical jack 3 about A-A exemplarily illustrated in FIG. 7D. FIG. 7C exemplarily illustrates a front sectional view of a tire 56 about A-A exemplarily illustrated in FIG. 7D. FIG. 7D exemplarily illustrates a right side view of a tire 56. To better illustrate the transmission unit 10, the overall assembly of tire 56 is presented in the FIG. 7C and FIG. 7D. The transmission unit 10 comprises the tire electrical jack 3, the conductive bearing 4, and the conductive wire 19. In this figure, the piezoelectric beam assembly 18 sets are excluded.

The conductive bearing 4 is operably connected to the tire electrical jack 3 to transmit the electrical energy received by the tire electrical jack 3 to the electrical storage unit 11. In an embodiment, the conductive bearing 4 comprises an inner ring 43, at least two input pins 52 and 53, an outer ring 42, and the at least two output pins 47 and 49. The inner ring 43 is operably engaged to the rim of the vehicle and configured to rotate with the rim.

The two input pins 52 and 53 are seated in the inner ring 43 for receiving an input signal from the tire electrical jack 3 mounted on the rim. The two input pins 52 and 53 are separated by an insulation layer 48 as exemplarily illustrated in FIG. 6A. The two input pins 52 and 53 are configured to engageably contact at least two ball bearings 41. The outer ring 42 is fixedly attached to the vehicle via an attachment member 51. An inner surface of the outer ring 42 and an outer surface of the inner ring 43 is grooved to seat the two ball bearings 41. The two ball bearings 41 are enclosed by side walls and separated by a central wall 45 as exemplarily illustrated in FIG. 6A. The space 46 between the two ball bearings 41 and the central wall 45 is filled with conductive grease to transmit the input signal from the two input pins 52 and 53 to the two output pins 47 and 49. The two output pins 47 and 49 are seated in the outer ring 42 and configured to engageably contact the two ball bearings 41 for transmitting the input signal received from the two ball bearings 41 to the electrical storage unit 11. The two output pins 47 and 49 are separated by an insulation layer 48 as exemplarily illustrated in FIG. 6A.

The piezoelectric energy harvesting system may further comprise a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams. The tire electrical jack may comprise input terminals for receiving the generated electrical energy from the output terminals of the sets of piezoelectric beams, with the input terminals are electrically separated by an insulation layer. The tire electrical jack may further comprise output terminals electrically connected to the input terminals for transferring the electrical energy to the conductive bearing, with the output terminals being electrically separated by an insulation layer. Moreover, the tire electrical jack may further comprise a housing configured to accommodate the input terminals, the insulation layer, and the output terminals, wherein the housing is seated in the rim of the tire and is insulated on an external surface.

FIG. 8A exemplarily illustrates a perspective view of a tire rim showing a tire electrical jack 3 mounted on the tire rim. FIG. 8B exemplarily illustrates an enlarged view of a tire electrical jack 3 mounted on a tire rim. Conductive wires 19 from the piezoelectric beam assembly 18 sets are connected to the tire electrical jack 3 that is mounted on the tire rim. Piezoelectric beam assemblies are not shown in FIG. 8A to give a better understanding out of the conductive wire 19 and tire electrical jack 3 position. FIG. 8B also shows an enlarged view of the tire electrical jack 3 mounted on the rim.

Another aspect of the present disclosure is directed to a piezoelectric energy harvesting system for converting mechanical energy of a tire of a vehicle to electrical energy for powering components of the vehicle. The piezoelectric energy harvesting system comprises a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assemblies comprises at least two output terminals for transmitting the generated electrical energy.

The piezoelectric energy harvesting system may further comprise a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams, the tire electrical jack comprising: a) input terminals for receiving the generated electrical energy from the output terminals of the sets of piezoelectric beams, wherein the input terminals are electrically separated by an insulation layer; b) output terminals electrically connected to the input terminals for transferring the electrical energy to the conductive bearing, wherein the output terminals are electrically separated by an insulation layer; and c) a housing configured to accommodate the input terminals, the insulation layer, and the output terminals, wherein the housing is seated in the rim of the tire, and wherein the housing is insulated on an external surface of the housing.

The piezoelectric energy harvesting system may further comprise a conductive bearing operably connected to the tire electrical jack to transmit the electrical energy received by the tire electrical jack to an electrical storage unit.

The conductive bearing may comprise an inner ring operably engaged to the rim of the vehicle and configured to rotate with the rim; and at least two input pins seated in an inner ring for receiving an input signal from the tire electrical jack mounted on the rim. The at least two input pins may be separated by an insulation layer, wherein the at least two input pins are configured to engageably contact at least two ball bearings. The conductive bearing may also comprise an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins.

Moreover, the conductive bearing may also comprise a configuration, such that the at least two output pins seated in the outer ring are configured to engageably contact the at least two ball bearings for transmitting the input signal received from the at least two ball bearings to the electrical storage unit. The at least two output pins may be separated by an insulation layer.

Furthermore, the conductive bearing may also be connected to the electrical storage unit configured to store the electrical energy transmitted by the conductive bearing, wherein the electrical storage unit is further configured to filter and rectify the transmitted electrical energy for powering components of the vehicle, wherein the electrical storage unit comprises a regulation unit for filtering, rectifying, and adapting the electrical energy transmitted by the conductive bearing. The regulation unit may comprise a low pass filter; a rectifier; a buck converter; and a battery for storing the regulated electrical energy received from the regulation unit for powering components of the vehicle.

The foregoing description comprise illustrative embodiments of the present invention. Having thus described exemplary embodiments of the present invention, it should be noted by those skilled in the art that the within disclosures are exemplary only, and that various other alternatives, adaptations, and modifications may be made within the scope of the present invention. Merely listing or numbering the steps of a method in a certain order does not constitute any limitation on the order of the steps of that method. Many modifications and other embodiments of the invention will come to mind to one skilled in the art to which this invention pertains having the benefit of the teachings presented in the foregoing descriptions. Although specific terms may be employed herein, they are used only in generic and descriptive sense and not for purposes of limitation. Accordingly, the present invention is not limited to the specific embodiments illustrated herein.

What is claimed is:

1. A piezoelectric energy harvesting system for converting mechanical energy of a tire of a vehicle to electrical energy for powering components of the vehicle, the piezoelectric energy harvesting system comprising:
a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assembly comprises at least two output terminals for transmitting the generated electrical energy;
a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams;
a conductive bearing operably connected to the tire electrical jack to transmit the electrical energy received by the tire electrical jack to an electrical storage unit, the conductive bearing comprising an inner ring operably engaged to the rim of the vehicle and configured to rotate with the rim, and at least two input pins seated in an inner ring for receiving an input signal from the tire electrical jack mounted on the rim, the at least two input pins separated by an insulation layer, wherein the at least two input pins are configured to engageably contact at least two ball bearings; and
an electrical storage unit configured to store the electrical energy transmitted by the conductive bearing, wherein the electrical storage unit is further configured to filter and rectify the transmitted electrical energy for powering components of the vehicle.

2. The piezoelectric energy harvesting system of claim 1, wherein the piezoelectric beams are of a generally rectangular geometric configuration.

3. The piezoelectric energy harvesting system of claim 1, wherein the piezoelectric beams further comprise an insulation layer.

4. The piezoelectric energy harvesting system of claim 1, wherein the tire electrical jack comprises:
    input terminals for receiving the generated electrical energy from the output terminals of the sets of piezoelectric beams, wherein the input terminals are electrically separated by an insulation layer;
    output terminals electrically connected to the input terminals for transferring the electrical energy to the conductive bearing, wherein the output terminals are electrically separated by an insulation layer; and
    a housing configured to accommodate the input terminals, the insulation layer, and the output terminals, wherein the housing is seated in the rim of the tire, and wherein the housing is insulated on an external surface of the housing.

5. The piezoelectric energy harvesting system of claim 1, wherein the tire electrical jack rotates integrally with the rim of the tire.

6. The piezoelectric energy harvesting system of claim 1, wherein the electrical storage unit comprises:
    a regulation unit for filtering, rectifying, and adapting the electrical energy transmitted by the conductive bearing, the regulation unit comprising:
    a low pass filter;
    a rectifier; and
    a buck converter;
    a battery for storing the regulated electrical energy received from the regulation unit for powering components of the vehicle.

7. A piezoelectric energy harvesting system for converting mechanical energy of a tire of a vehicle to electrical energy for powering components of the vehicle, the piezoelectric energy harvesting system comprising:
    a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assembly comprises at least two output terminals for transmitting the generated electrical energy;
    a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams, the tire electrical jack comprising:
    input terminals for receiving the generated electrical energy from the output terminals of the sets of piezoelectric beams, wherein the input terminals are electrically separated by an insulation layer;
    output terminals electrically connected to the input terminals for transferring the electrical energy to the conductive bearing, wherein the output terminals are electrically separated by an insulation layer; and
    a housing configured to accommodate the input terminals, the insulation layer, and the output terminals, wherein the housing is seated in the rim of the tire, and wherein the housing is insulated on an external surface of the housing;
    a conductive bearing operably connected to the tire electrical jack to transmit the electrical energy received by the tire electrical jack to an electrical storage unit, the conductive bearing comprising:
    an inner ring operably engaged to the rim of the vehicle and configured to rotate with the rim;
    at least two input pins seated in an inner ring for receiving an input signal from the tire electrical jack mounted on the rim, the at least two input pins separated by an insulation layer, wherein the at least two input pins are configured to engageably contact at least two ball bearings;
    an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins;
    the at least two output pins seated in the outer ring and configured to engageably contact the at least two ball bearings for transmitting the input signal received from the at least two ball bearings to the electrical storage unit, wherein the at least two output pins are separated by an insulation layer; and
    the electrical storage unit configured to store the electrical energy transmitted by the conductive bearing, wherein the electrical storage unit is further configured to filter and rectify the transmitted electrical energy for powering components of the vehicle, wherein the electrical storage unit comprises:
    a regulation unit for filtering, rectifying, and adapting the electrical energy transmitted by the conductive bearing, the regulation unit comprising:
    a low pass filter;
    a rectifier;
    a buck converter; and
    a battery for storing the regulated electrical energy received from the regulation unit for powering components of the vehicle.

8. The piezoelectric energy harvesting system of claim 7, wherein the piezoelectric beams are of a generally rectangular geometric configuration.

9. The piezoelectric energy harvesting system of claim 7, wherein the piezoelectric beams further comprise an insulation layer.

10. The piezoelectric energy harvesting system of claim 7, wherein the tire electrical jack rotates integrally with the rim of the tire.

11. The piezoelectric energy harvesting system of claim 7, wherein the rectifier is a bridge-wave rectifier.

12. A piezoelectric energy harvesting system for converting mechanical energy of a tire of a vehicle to electrical energy for powering components of the vehicle, the piezoelectric energy harvesting system comprising:
    (a) a plurality of sets of piezoelectric beam assemblies embedded in the tire of the vehicle and electrically connected in a parallel configuration, wherein each of the sets of the piezoelectric beam assemblies comprise a plurality of piezoelectric beam assemblies, the piezoelectric beam assemblies electrically connected in a series configuration for converting mechanical strains on the piezoelectric beam assemblies to electrical energy, and wherein each of the piezoelectric beam assembly comprises at least two output terminals for transmitting the generated electrical energy;

(b) a tire electrical jack mounted on a rim of the tire, the tire electrical jack electrically connected to the at least two output terminals of the sets of the piezoelectric beam assemblies, wherein the tire electrical jack receives the electrical energy generated by the sets of piezoelectric beams, the tire electrical jack comprising:
  (i) input terminals for receiving the generated electrical energy from the output terminals of the sets of piezoelectric beams, wherein the input terminals are electrically separated by an insulation layer;
  (ii) output terminals electrically connected to the input terminals for transferring the electrical energy to the conductive bearing, wherein the output terminals are electrically separated by an insulation layer; and
  (iii) a housing configured to accommodate the input terminals, the insulation layer, and the output terminals, wherein the housing is seated in the rim of the tire, and wherein the housing is insulated on an external surface of the housing;

(c) a conductive bearing operably connected to the tire electrical jack to transmit the electrical energy received by the tire electrical jack to an electrical storage unit; wherein the conductive bearing comprises:
  (i) an inner ring operably engaged to the rim of the vehicle and configured to rotate with the rim;
  (ii) at least two input pins seated in an inner ring for receiving an input signal from the tire electrical jack mounted on the rim, the at least two input pins separated by an insulation layer, wherein the at least two input pins are configured to engageably contact at least two ball bearings;
  (iii) an outer ring fixedly attached to the vehicle via an attachment member, wherein an inner surface of the outer ring and an outer surface of the inner ring is grooved to seat the at least two ball bearings, the at least two ball bearings enclosed by side walls and separated by a central wall, wherein the space between the at least two ball bearings and the central wall is filled with conductive grease to transmit the input signal from the at least two input pins to at least two output pins; and
  (iv) the at least two output pins seated in the outer ring and configured to engageably contact the at least two ball bearings for transmitting the input signal received from the at least two ball bearings to the electrical storage unit, wherein the at least two output pins are separated by an insulation layer.

13. The piezoelectric energy harvesting system of claim 12, wherein the piezoelectric beams are of a generally rectangular geometric configuration.

14. The piezoelectric energy harvesting system of claim 12, wherein the piezoelectric beams further comprise an insulation layer.

15. The piezoelectric energy harvesting system of claim 12, wherein the tire electrical jack rotates integrally with the rim of the tire.

16. The piezoelectric energy harvesting system of claim 12, wherein the rectifier is a bridge-wave rectifier.

* * * * *